US012736881B2

(12) United States Patent
Carcasi et al.

(10) Patent No.: US 12,736,881 B2
(45) Date of Patent: Sep. 15, 2026

(54) PROVIDING A BARRIER LAYER FOR PHOTORESIST PROCESSING

(71) Applicant: Tokyo Electron Limited, Tokyo (JP)

(72) Inventors: Michael Carcasi, Austin, TX (US); Ryan Burns, Austin, TX (US); Lior Huli, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 908 days.

(21) Appl. No.: 17/887,946

(22) Filed: Aug. 15, 2022

(65) Prior Publication Data

US 2023/0259030 A1 Aug. 17, 2023

Related U.S. Application Data

(60) Provisional application No. 63/310,207, filed on Feb. 15, 2022.

(51) Int. Cl.

*G03F 7/11* (2006.01)
*G03F 7/004* (2006.01)
*G03F 7/16* (2006.01)
*G03F 7/38* (2006.01)
*H10P 76/20* (2026.01)

(52) U.S. Cl.

CPC .............. *G03F 7/11* (2013.01); *G03F 7/0043* (2013.01); *G03F 7/162* (2013.01); *G03F 7/38* (2013.01); *H10P 76/2041* (2026.01)

(58) Field of Classification Search

CPC ... G03F 7/11; G03F 7/09; G03F 7/094; G03F 7/16

See application file for complete search history.

(56) References Cited

U.S. PATENT DOCUMENTS

2008/0193883 A1* 8/2008 Endo ..................... G03F 7/2041 525/186
2009/0042148 A1* 2/2009 Padmanaban ......... G03F 7/0397 430/286.1
2010/0112482 A1* 5/2010 Watanabe ............ G03F 7/0046 549/417
2017/0192357 A1* 7/2017 Carcasi ................. G03F 7/0382
2019/0393035 A1* 12/2019 O'Meara ............... H10P 76/405
2021/0305040 A1* 9/2021 Kuo ........................ G03F 7/168
2022/0028684 A1* 1/2022 Chen ....................... G03F 7/167

OTHER PUBLICATIONS

Sanders et al., "Self-segregating materials for immersion lithography," Proc. SPIE 6923, Advances in Resist Materials and Processing Technology XXV, 692309 (Apr. 4, 2008); doi: 10.1117/12.772937, 13 pages.
Yang et al., "A Comprehensive Review on Water Diffusion in Polymers Focusing on the Polymer-Metal Interface Combination," www.mdpi.com/journal/polymers, doi:10.3390/polym12010138, Jan. 6, 2020, 27 pages.
Bastarrachea et al., "Engineering Properties of Polymeric-Based Antimicrobial Films for Food Packaging: A Review," Food Engineering Reviews, Mar. 15, 2011, DOI: 10.1007/s12393-011-9034-8, 16 pages.

* cited by examiner

*Primary Examiner* — Daborah Chacko-Davis
(74) *Attorney, Agent, or Firm* — Slater Matsil, LLP

(57) ABSTRACT

In certain embodiments, a method of microfabrication includes forming a layer stack on a wafer, the layer stack including a photoresist layer formed on an underlying layer. The method further includes depositing a barrier layer on the photoresist layer, the barrier layer selected to prevent penetration from one or more environmental components. The method further includes exposing the photoresist layer to a pattern of actinic radiation and developing the photoresist layer.

20 Claims, 20 Drawing Sheets

PROVIDING A BARRIER LAYER FOR PHOTORESIST PROCESSING

CROSS-REFERENCE TO RELATED APPLICATIONS

This application claims the benefit of U.S. Provisional Application No. 63/310,207, filed on Feb. 15, 2022, which application is hereby incorporated herein by reference.

TECHNICAL FIELD

This disclosure relates generally to semiconductor fabrication, and, in particular embodiments, to providing a barrier layer for photoresist processing.

BACKGROUND

Semiconductor devices typically are fabricated by sequentially depositing insulating or dielectric layers, conductive layers, and other layers of material over a semiconductor substrate, and patterning the layers using lithography to form circuit components and elements on the substrate. The semiconductor industry continues to increase the density of electronic components (e.g., transistors, diodes, resistors, capacitors, etc.) by continual reductions in minimum feature size, allowing more components to be integrated into a particular area.

SUMMARY

In certain embodiments, a method of microfabrication includes forming layer stack on a wafer, the layer stack including a photoresist layer formed on an underlying layer. The method further includes depositing a barrier layer on the photoresist layer, the barrier layer selected to prevent penetration from one or more environmental components. The method further includes exposing the photoresist layer to a pattern of actinic radiation and developing the photoresist layer.

In certain embodiments, a method of microfabrication includes receiving a wafer to be patterned by photolithography. The method further includes selecting a photoresist formula including photoresist components and barrier layer components. The photoresist formula is configured to self-segregate so that the barrier layer components separate vertically above the photoresist components. The method further includes depositing the photoresist formula on the wafer by spin-on deposition, the photoresist formula self-segregating into a photoresist layer underlying a barrier layer. The method further includes exposing the photoresist layer to a pattern of actinic radiation and developing the photoresist layer.

In certain embodiments, a method of microfabrication includes forming a layer stack on a wafer, the layer stack including a photoresist layer formed over one or more underlying layers. The method further includes depositing a barrier layer on the photoresist layer by vapor-phase deposition. The barrier layer is selected to prevent penetration from one or more environmental components. The method further includes exposing the photoresist layer to a pattern of actinic radiation and developing the photoresist layer.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

Figure 1:
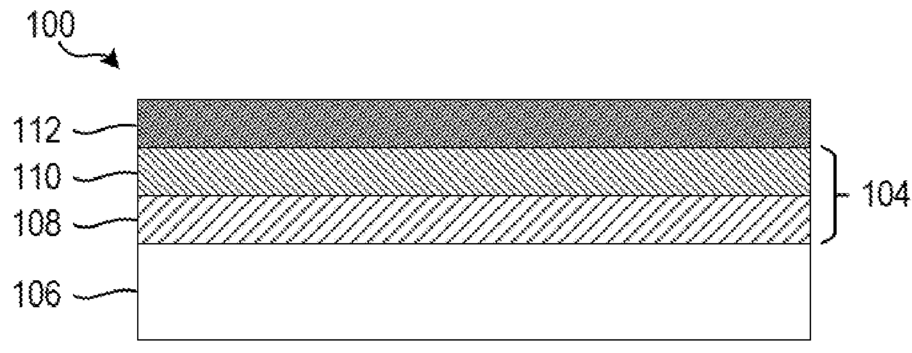
FIG. 1 illustrates a cross-sectional view of an example semiconductor workpiece having a barrier layer formed on a photoresist layer, according to certain embodiments.

Extreme ultraviolet (EUV) lithography has now entered high volume manufacturing (HVM) using a numerical aperture (NA) of 0.33 and will likely be extended to an NA of 0.55 in the future with the goal of achieving a resolution of 8 nm half pitch or beyond. Reducing stochastic defects and improving the resolution, line edge roughness, sensitivity (RLS) triangle continues to be a challenge in EUV technology. These technical hurdles have created an ongoing search for spin-on photoresist materials of several different varieties, including conventional chemically amplified resists (CAR) and organo-metal oxide resists.

Generally lithography photoresists and subsequent patterning film stacks exhibit some sensitivity to the outside environment either from moisture or other chemicals such as amines. Metal-oxide (MOx) photoresists for EUV lithography, and potentially other spun-on metal layers, can be sensitive to moisture, humidity, and the like, and can exhibit variation in critical dimension. During exposure of the photoresist to actinic radiation, electrophilic metal centers of MOx photoresists can become deprotected from radiolysis.

For example, the radiation to which portions of MOx photoresists are exposed during an exposure step may cleave the ligands that are attached to the electrophilic metal centers, leaving those metal centers unprotected. Atmospheric water ($H_2O$), hydroxide (OH) nucleophiles, or other atmospheric substances may attack the deprotected active sites, and hydroxylated active sites then condense driving network formation and promoting covalent bonding with the substrate where favorable, such as with silicon and spin-on-glass substrates. An Oxo-network, resulting from condensation, is insoluble to most developer solvents, or at least may solvate at a different and possibly slower rate than expected. As a result, certain portions of the photoresist that are intended to be removed during the photoresist process might not actually be removed, which can affect the resulting critical dimensions of openings or other structures formed in the photoresists, as well as in subsequent structures that are etched in underlying layers using the flawed photoresist as an etch mask.

Additionally, an amount of moisture that is absorbed by the photoresist films during photoresist processing (e.g., following exposure and prior to/during a post-exposure bake (PEB) process) may vary from wafer-to-wafer or even within different areas of a same wafer, which can lead to critical dimension variation from wafer-to-wafer or on the same wafer.

Certain embodiments of this disclosure include methods and films to mitigate impacts from environmental molecules that might inhibit performance or stability over time, such as by causing a target critical dimension in a photoresist film (or subsequently etched layer) to be missed and/or by causing variation in critical dimension. Certain embodiments of this disclosure provide barrier layers, which also may be referred to as "top coats," deposited on photoresist layers (e.g., MOx photoresist layers), or even other spun-on metal-containing films, to limit permeability of environmental components such as moisture/humidity to enhance patterning stability of photoresist materials. Certain embodiments may provide for high numerical aperture (NA) EUV lithography. Furthermore, certain embodiments may apply to various types of lithography, including EUV lithography, deep ultraviolet (DUV) lithography, electron beam (e-beam) lithography, and other types of lithography, some of which may overlap in type.

Certain embodiments include a spin-on film (e.g., a barrier layer) for deposition over a patterning stack, (for example a photoresist stack) to retain the chemical composition of the photoresist (potentially including moisture), as well as block environmental components (potentially including moisture) from entering the photoresist layer or layer stack. The barrier layer may limit $H_2O$ permeability, will not solvate or otherwise impact the photoresist upon deposition, will have little or no impact on reactions during exposure or post exposure bake (PEB), and/or may be possible to solvate or strip quickly either during photoresist development or prior to the photoresist development step.

FIG. 1 illustrates a cross-sectional view of an example semiconductor workpiece 100 having a barrier layer formed on a photoresist layer, according to certain embodiments. In the illustrated example, semiconductor workpiece 100 includes a layer stack 104 positioned on a substrate 106.

Semiconductor workpiece 100 generically refers to any suitable semiconductor element being processed in accordance with embodiments of this disclosure. Semiconductor workpiece 100 also may be referred to as a wafer, such as a silicon wafer.

Substrate 106 may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate 106 is not limited to any particular base structure, underlying layer or overlying layer, patterned or un-patterned, but rather, may include any such layer or base structure, and any combination of layers and/or base structures. Substrate 106 may be a bulk substrate such as a bulk silicon wafer, a silicon-on-insulator (SOI) wafer, or various other semiconductor substrates.

In certain embodiments, substrate 106 may include silicon germanium, silicon carbide, gallium arsenide, gallium nitride, or other compound semiconductors. In certain embodiments, substrate 106 includes heterogeneous layers such as silicon germanium on silicon, gallium nitride on silicon, silicon carbon on silicon, as well layers of silicon on a silicon or SOI substrate. In certain embodiments, substrate 106 is patterned or embedded in other components of a semiconductor device.

Layer stack 104 may be a photolithography stack. In the illustrated example, layer stack 104 includes underlying layer 108 and photoresist layer 110. Although layer stack 104 is illustrated as including a particular number of layers, layer stack 104 may include any suitable number of layers.

Underlying layer 108 represents any suitable combination of one or more layers, one or more of which are to be patterned using photoresist layer 110. For example, underlying layer 108 may include a hard mask layer, a planarization layer, an amorphous carbon layer, a silicon carbide layer, a bottom anti-reflective coating, and/or any other layer, one or more of which may be useful for a patterning process. Additionally or alternatively, underlying layer 108 may include a stack of films. For example, underlying layer 108 may include films of dielectric and/or conductive materials, such as oxide, silicon oxide, silicon nitride, silicon oxynitride, silicon carbide, titanium nitride, tantalum nitride, their alloys, and combinations thereof. For example, underlying layer 108 can be a dielectric layer or alternating dielectric layers.

Underlying layer 108 and/or substrate 106 may include a number of layers including doping regions for forming active devices in various embodiments. This disclosure contemplates substrate 106 and underlying layer 108 having any suitable thickness.

Layer stack 104 may be formed in any suitable manner, including using any suitable combination of wet and/or dry deposition and etch techniques. For example, layer stack 104 may be deposited using any technique appropriate for the material to be deposited and the semiconductor feature being formed. Suitable deposition processes may include a spin-on coating process, a chemical vapor deposition (CVD) process, an atomic layer deposition (ALD) process, plasma deposition processes (e.g., a plasma-enhanced CVD (PECVD) process), and/or other layer deposition processes or combinations of processes.

Photoresist layer 110 may include any suitable type of layer that may be used to form a masking layer for patterning underlying layer 108, and may be made of a suitable material for acting as a photoresist. Layer stack 104 includes a photoresist layer to be patterned by an exposure, such as by using an exposure module, which may be referred to as a scanner or stepper. For example, a photoresist layer may include a light-sensitive material made of a polymer, a solvent, and a sensitizer. The polymer is designed to change its structure when exposed to actinic radiation. The solvent allows the material of photoresist layer 110 to be spun to form a thin layer on an underlying layer (e.g., underlying layer 108). The sensitizer (or inhibitor) controls the photoreaction in a polymer phase.

As examples, photoresist layer 110 can be a CAR EUV resist and/or an organometallic EUV resist. For example, photoresist layer 110 may be a metal-based resist material such as an organometallic material such as a MOx photoresist. An organometallic photoresist layer 110 may include metal oxide cores surrounded by organic alkyl groups covalently bonded to the metal oxide cores. The metal oxide core can be tin oxide, hafnium oxide, zinc oxide, and zirconium oxide, for example. As just one particular example, the metal of a MOx photoresist may be tin (Sn), and the MOx photoresist may be generated from tin-containing precursor and an oxygen-containing precursor. The metal atoms in the metal oxide cores absorb EUV light more strongly than the carbon and oxygen atoms in organic polymer resists making the organometallic EUV resists more EUV sensitive.

The photoresist material may be processed in two stages to create a pattern for further processing underlying layers (e.g., underlying layer 108): an exposure stage and a development stage. During the exposure stage, the photoresist material reacts to ultraviolet (UV) or other light to form a pattern on the photoresist material according to a pattern mask. Depending on the type of photoresist material used, portions of the photoresist that are exposed to UV light may become more or less soluble in a developer solution, such that those exposed regions may become more difficult or less difficult, respectively, to remove when processed using the developer solution. For example, due to exposure to the UV light, portions of the photoresist that are exposed to the UV light may have different material properties than unexposed regions of the photoresist. The different material properties may include volatility, reactivity, and/or solubility, for example. During the development stage, the photoresist material is exposed to a developer solution to remove portions of the photoresist layer.

The photoresist material may be a positive photoresist or a negative photoresist. For a positive photoresist, areas of the photoresist layer that the semiconductor fabricator intends to remove (and that generally correspond to areas of an underlying layer that will be removed using the photoresist as an etch mask) are exposed to the UV light. The UV light changes the chemical structure of the exposed areas of the photoresist such that the exposed areas become more soluble in a developer solvent that can be used to remove the exposed areas in a development processing stage while the areas of the photoresist that are not exposed remain. For a negative photoresist, portions of the photoresist layer that are exposed to UV polymerize, crosslink, network, or otherwise change chemical composition making the exposed regions less soluble to the developer solution while unexposed regions can be removed using the developer solution.

In certain embodiments, photoresist layer 110 may also include a PAG that releases a photoacid in response to UV light exposure. The generated photoacid may induce further chemical reactions in photoresist layer 110, which may improve the tonality in the patterned version of photoresist layer 110.

Photoresist layer 110 may have any suitable thickness. In certain embodiments, photoresist layer 110 has a thickness of 5 nm to 100 nm, for example 10 nm to 30 nm. In certain embodiments, these thickness ranges may have particular applicability to EUV, including potentially high-numerical-aperture (NA) EUV. These or other thickness ranges, however, may be suitable for EUV or photolithography technologies at other wavelengths (e.g., DUV, e-beam, 193 nm immersion, or others). It should be understood that these thickness values are provided as examples only, and that photoresist layer 110 may have any suitable thickness.

As described above, environmental conditions may affect the properties of photoresist layer 110 during subsequent process. Such environmental conditions may include absorption of moisture (e.g., $H_2O$) during processing, such as between an exposure stage of processing photoresist layer 110 and a PEB stage of processing, which may occur prior to the development stage of processing.

Certain embodiments of this disclosure incorporate a barrier layer 112 formed on photoresist layer 110. Barrier layer 112 also may be referred to as a barrier film. In certain embodiments, barrier layer 112 also may be referred to as a top coat barrier. Barrier layer 112 may serve one or more purposes. For example, barrier layer 112 may be designed to prevent penetration from one or more environmental components into photoresist layer 110. Such environmental components may include moisture, such as water vapor for example. For purposes of this disclosure, it will be understood that preventing penetration from one or more environmental components may include inhibiting such penetration by reducing or eliminating additional absorption of moisture into photoresist layer 110 following deposition of barrier layer 112 on photoresist layer 110.

In certain embodiments, barrier layer 112 may be a material with low permeability to environmental components, such as moisture. Permeability may be characterized by equation (1):

$$P_A = \frac{[\text{flux of } A]}{[\Delta p_A/d]}, \tag{1}$$

where permeability is defined as the flux of penetrant (e.g., moisture) A divided by the partial pressure driving force ($\Delta p_A$), and multiplied by the thickness of the film (d). Permeability can further be related to both the kinetic diffusion coefficient ($D_A$) and the thermodynamic sorption coefficient ($S_A$) via the following equation (2):

$$P_A = D_A S_A P_A \tag{2}$$

The barrier materials of barrier layer 112 may be selected to have either a low penetrant diffusion coefficient, a low penetrant solubility coefficient, or both. For selection of coatings to be used as moisture barriers, these coatings can be, for example, linear, low free volume, non-polar polymers. Examples of such materials includes high-density polyethylene (HDPE), polyvinylidene chloride (PVDC), polypropylene, polyethylene terephthalate (PET), polyamide, low-density polyethylene (LPDE), or ethylene-vinyl acetate. Barrier layer 112 may have a water vapor permeability (WVP) property of 0 gram per second per square meter per pascal (abbreviated as [g m $m^{-2}$ $s^{-1}$ $Pa^{-1}$]) to $3.5\times10^{-14}$ [g m $m^{-2}$ $s^{-1}$ $Pa^{-1}$], for example $1.0\times10^{-14}$ [g m $m^{-2}$ $s^{-1}$ $Pa^{-1}$] to $2.0\times10^{-14}$ [g m $m^{-2}$ $s^{-1}$ $Pa^{-1}$]. It should be understood that these WVP values are provided as examples only, and that barrier layer 112 may have any suitable WVP value.

In certain embodiments, in addition to low permeability for environmental penetrants, barrier layer 112 may have other properties, including, for example, an ability to coat on top of a photoresist material with little to no impact on the photoresist to otherwise function, and an ability to be stripped prior to photoresist development or be removed during photoresist development with little to no impact on photoresist functionality.

Barrier layer 112 may be formed on layer stack 104 (e.g., on photoresist layer 110) using various deposition techniques and at various phases of a process for patterning photoresist layer 110 into a pattern for use in etching underlying layer 108.

In certain embodiments, barrier layer 112 is deposited on photoresist layer 110 using a spin-on deposition technique, which also may be referred to as spin-coating. With spin-on deposition, a particular material (e.g., the material of barrier layer 112) is deposited on a substrate (e.g., on underlying layer 108 formed on substrate 106). The substrate is then rotated (if not already rotating, possibly at a relatively low velocity) at a relatively high velocity so that centrifugal force causes deposited material to move toward edges of the substrate, thereby coating the substrate. Excess material is typically spun off the substrate. Additionally or alternatively, barrier layer 112 may be deposited using any suitable wet or dry process, such as a CVD, PECVD, ALD, or other suitable process.

In certain embodiments, barrier layer 112 may be deposited in a deposition module (e.g., a spin-coating module) of a larger track system for a lithography process. An example lithography system that includes a track system is described in greater detail below with reference to FIG. 12.

Continuing with FIG. 1, in certain embodiments, barrier layer 112 is deposited prior to exposing layer stack 104 (e.g., including photoresist layer 110) to a pattern of actinic radiation. Additionally or alternatively, in certain embodiments, barrier layer 112 is deposited subsequent to exposing layer stack 104 (e.g., including photoresist layer 110) to a pattern of actinic radiation. In certain embodiments, the patterning process includes a PEB phase, and barrier layer 112 is deposited prior to executing the PEB.

Barrier layer 112 may have any suitable thickness. In certain embodiments, barrier layer 112 has a thickness of 0.5 nm to 50 nm, for example 1 nm to 10 nm. It should be understood that these thickness values are provided as examples only, and that barrier layer 112 may have any suitable thickness.

FIGS. 2-7 illustrate example techniques for incorporating barrier layer 112 into a patterning process (e.g., a photolithography process). For brevity and clarity, this description adopts a convention in which elements adhering to the pattern [x02] may be related implementations of a process and/or semiconductor workpiece in certain embodiments. For example, except as otherwise stated or readily apparent, semiconductor workpiece 200 may be similar to semiconductor workpiece 100, patterning process 302 may be similar to patterning process 202, and the like. An analogous convention has also been adopted for other elements as made clear by the use of similar terms in conjunction with the described three-digit numbering system. Through this convention, where applicable, features that have already been described are incorporated by reference without being repeated.

FIGS. 2A-2F illustrate cross-sectional views of an example semiconductor workpiece 200 during an example patterning process 202, according to certain embodiments. In the example illustrated FIGS. 2A-2F, a barrier layer 212 is deposited after photoresist layer 210 is formed on semiconductor workpiece 200 and exposed to actinic radiation, but prior to development of photoresist layer 210 (and, more particularly, prior to a PEB phase).

Figure 2A:
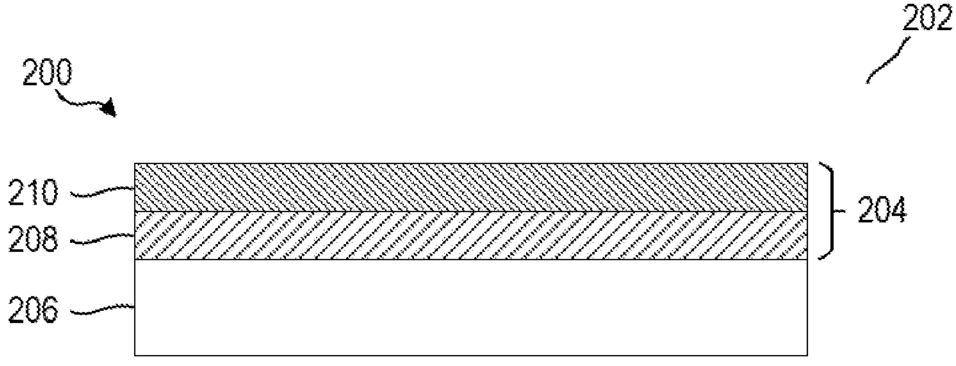
FIGS. 2A-2F illustrate cross-sectional views of an example semiconductor workpiece during an example patterning process, according to certain embodiments.

As shown in FIG. 2A, a layer stack 204 may be formed on a substrate 206. In this example, layer stack 204 includes photoresist layer 210. In certain embodiments, photoresist layer 210 is deposited on underlying layer 208 of layer stack 204 in a deposition module (e.g., a spin-coating module) of a larger track system for a lithography process. An example lithography system that includes a track system is described in greater detail below with reference to FIG. 12. It should be understood, however, that photoresist layer 210 may be deposited using any suitable dry or wet process.

Figure 2B:
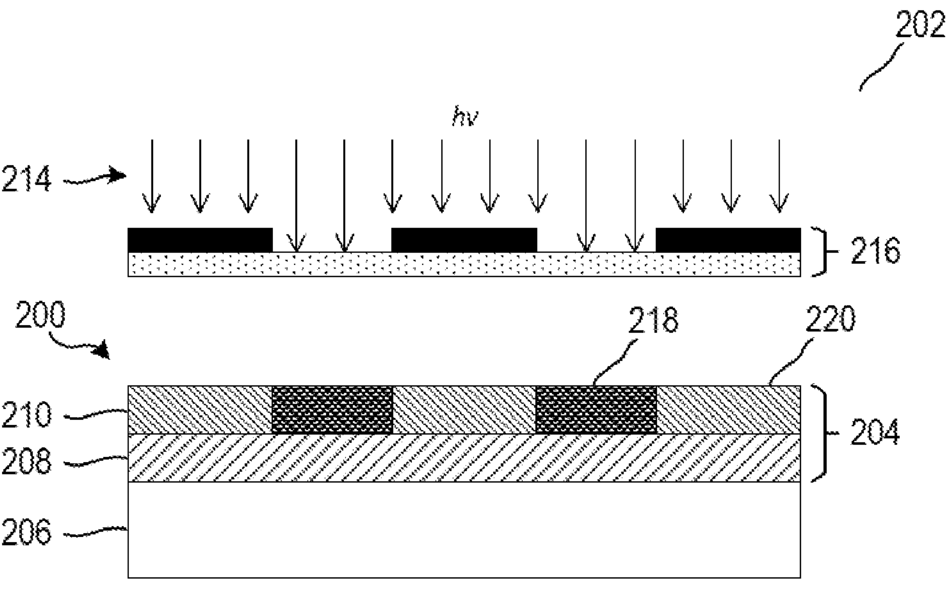

As shown in FIG. 2B, photoresist layer 210 is exposed to a pattern of actinic radiation 214 (is irradiated) to form a pattern in photoresist layer 210. This may be referred to as an exposure phase of a photolithography process. For example, actinic radiation 214 may be directed toward semiconductor workpiece 200, and particularly to a surface of photoresist layer 210, through a patterned mask 216 to cause a target pattern to form in photoresist layer 210. The target pattern may include exposed regions 218 and unexposed regions 220. Depending on whether a positive photoresist or a negative photoresist is used, exposed regions 218 of photoresist layer 210 may be designed to be removed or to remain when photoresist layer 210 is developed in a later step. In the illustrated example, as will be shown in connection with FIG. 2F, exposed regions 218 are designed to be removed such that a pattern of patterned mask 216 corresponds to the target pattern to be formed in photoresist layer 210.

Techniques for lithography may include photolithography, electron beam (e-beam) lithography, extreme ultraviolet (EUV) lithography, and other types of lithography, some of which may overlap in type.

In certain embodiments, semiconductor workpiece 200 is transferred from the above-described track system to an exposure module (which also may be referred to as a stepper module or scanner module) for exposing photoresist layer 210 to the pattern of actinic radiation. An example lithography system that includes a projection scanner is described in greater detail below with reference to FIG. 12.

Figure 2C:
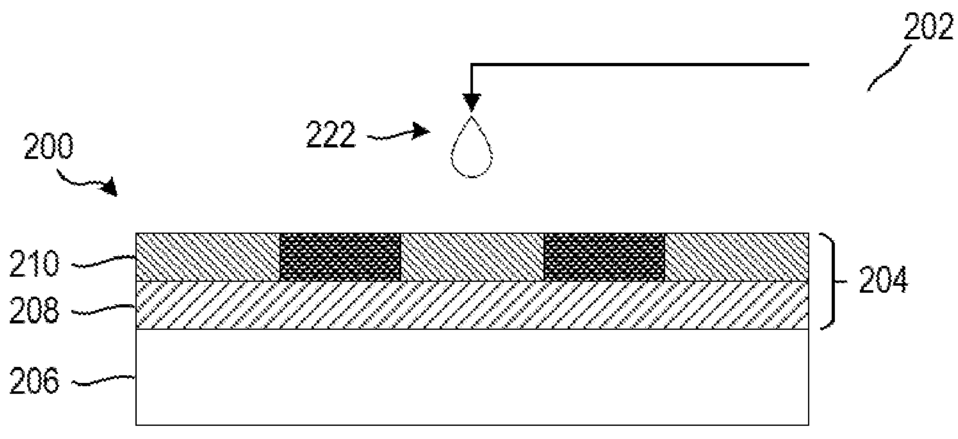

As shown in FIG. 2C, in certain embodiments, a liquid rinse 222 may be performed following the exposure phase and prior to deposition of a barrier layer (barrier layer 212) at a subsequent step. Liquid 22 may include deionized water or any suitable liquid. It should be understood that performing the liquid rinse is optional.

Liquid rinse 222 may be performed to introduce a controlled amount of moisture into layer stack 204, including into photoresist layer 210, prior to forming barrier layer 212, which in part may seal in the amount of moisture. As described above, one problem that may be encountered during photoresist processing is variation in an amount of moisture absorption from wafer-to-wafer or within wafer, which can lead to critical dimension variation from wafer-to-wafer or on the same wafer.

In certain embodiments, performing liquid rinse 222 may reduce or eliminate variation in moisture absorption by deliberately introducing a known amount of moisture into layer stack 204, including into photoresist layer 210, and then equilibrating that known amount of moisture with the deposition of a barrier layer 212, as described below with reference to FIG. 2D. Barrier layer 212 may then reduce or eliminate additional moisture absorption into photoresist layer 210. Introducing the known amount of moisture may allow other process parameters (e.g., energy used for exposure phase) to be adjusted and optimized to account for the known amount of moisture and still achieve the target critical dimension to thereby reduce or eliminate variation in critical dimension from wafer-to-wafer or within the same wafer. A standard liquid rinse may quickly saturate the below patterning stack (e.g., including photoresist layer 210 and potentially one or more of underlying layer 208 and substrate 206).

In certain embodiments, depending on the configuration and capabilities of the apparatuses involved, liquid rinse 222 may be performed in the exposure system or by another system separate from the exposure system and the track system, or may be performed after transferring semiconductor workpiece 200 from the exposure system back to a track system such that liquid rinse 222 is performed by a suitable module of the track system.

Figure 2D:
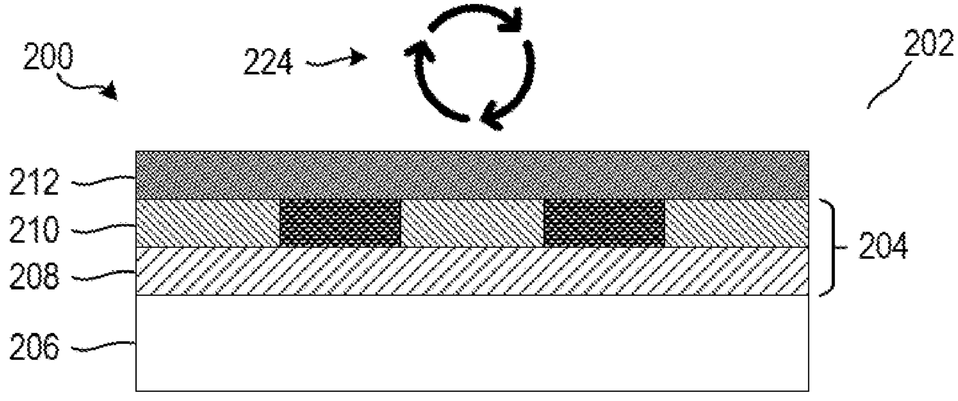

As illustrated in FIG. 2D, barrier layer 212 may be deposited on layer stack 204 (e.g., on photoresist layer 210) using various deposition techniques, including any suitable dry or wet deposition process.

In certain embodiments, barrier layer 212 is deposited on photoresist layer 210 using a spin-on deposition technique 224. In certain embodiments, spin-on deposition technique 224 includes dispensing liquid chemicals onto photoresist layer 210 using a coating module with a liquid delivery system that may dispense one or more types of liquid chemicals. The dispense volume can be between 0.2 ml to 10 ml, for example 0.5 ml to 2 ml. The substrate (e.g., workpiece 200) may be secured to a rotating chuck that supports the substrate. The rotating speed during liquid dispense can be between 50 rpm to 3000 rpm, for example 1000 rpm to 2000 rpm. The system may also include an anneal module that may bake or apply light radiation to the substrate after the chemicals have been dispensed. It should be understood that this example spin-on deposition technique 224 and associated values are provided as examples only. Additionally or alternatively, barrier layer 212 may be deposited using a CVD or other suitable process, an example of which is described with reference to FIGS. 6A-6E and 7A-7E.

Continuing with the example of FIGS. 2A-2F, barrier layer 212 is deposited subsequent to exposing layer stack 204 (e.g., including photoresist layer 210) to the pattern of actinic radiation 214, as well as prior to executing the PEB, as described below with reference to FIG. 2E. In certain embodiments, barrier layer 212 can remain on layer stack 204 (e.g., on photoresist layer 210) through the PEB with little or no impact to the PEB before removing barrier layer 212 during a later phase (e.g., prior to or during a development phase).

In certain embodiments, depending on the configuration and capabilities of the apparatuses involved, and to the extent semiconductor workpiece 200 has not already been transferred back to a track system as part of performing liquid rinse 222, deposition of barrier layer 212 may be performed in the exposure system or by another deposition system separate from the exposure system and the track system, or may be performed after transferring semiconductor workpiece 200 from the exposure system back to the track system such that depositing barrier layer 212 (e.g., using spin-on deposition technique 224) is performed by a suitable deposition module of the track system.

Figure 2E:
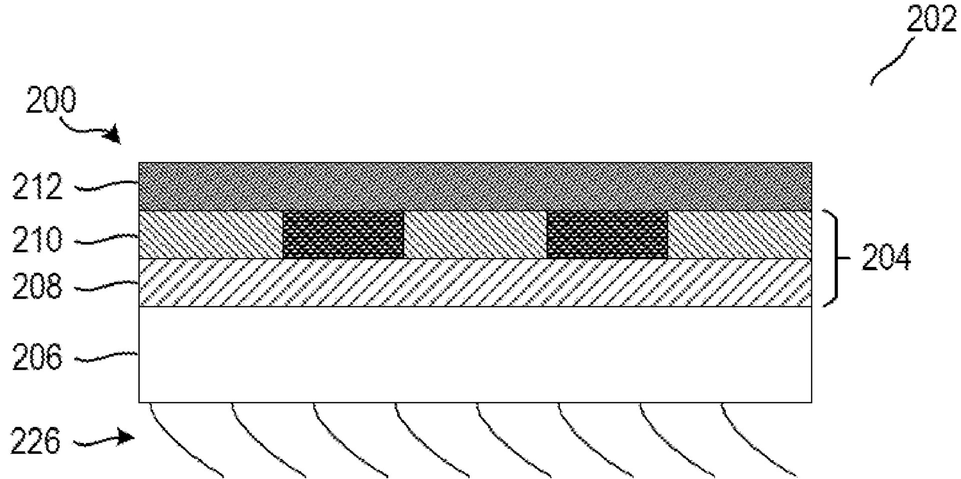

As illustrated in FIG. 2E, a PEB 226 may be performed. PEB 226 may be performed to further differentiate the material properties between exposed regions 218 and unexposed regions 220. In certain embodiments, PEB 226 may be performed by heating semiconductor workpiece 200 in a process chamber at a temperature between 50° C. to 250° C., for example between 180° C. to 225° C. in certain embodiments, in vacuum or under a gas flow. In a particular example, semiconductor workpiece 200 is baked for 1 to 3 minutes. The PEB bake conditions may be selected to promote a degree of crosslinking in the exposed resist for improved contrast and reduced line edge roughness (LER). This disclosure contemplates executing PEB 226 in any suitable manner.

In certain embodiments, to the extent semiconductor workpiece 200 has not already been transferred back to a track system as part of performing liquid rinse 222 or barrier layer 212 deposition (e.g., using spin-on deposition technique 224), semiconductor workpiece 200 may be transferred from the exposure system back to the track system such that PEB 226 is performed by a suitable module of the track system.

The presence of barrier layer 212 on photoresist layer 210 prior to and during PEB 226 may mitigate environmental impacts on photoresist layer 210. For example, barrier layer 212 may lock in a state of photoresist layer 210 following exposure to actinic radiation 214 (or following liquid rinse 222, if applicable), and prevent subsequent penetration of one or more environmental components (e.g., water vapor) following deposition of barrier layer 212.

Figure 2F:
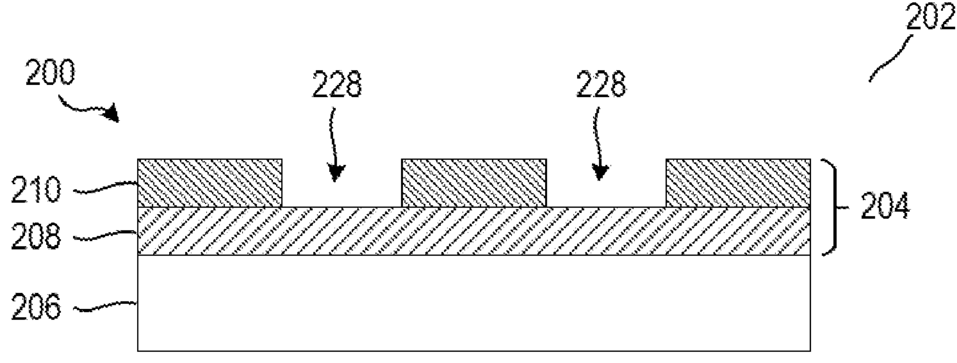

As illustrated in FIG. 2F, in a developing phase, photoresist layer 210 may be developed using a suitable development process. During the developing phase, and according to the illustrated example of a positive photolithography process, exposed regions 218 of photoresist layer 210 may be removed using a suitable dry etch or wet etch process, and thereby forming photoresist layer 210 into a mask according to pattern mask 216 that can then be used to etch underlying layer 208, if desired. For example, the developing phase may form openings 228 in photoresist layer 210. Openings 228 in photoresist layer 210 may be used in an etching process to etch features in underlying layer 208.

In certain embodiments, due at least in part to the protection provided by barrier layer 212 in preserving a state of photoresist layer 210 and/or preventing additional penetration of one or more environmental components (e.g., water vapor) following deposition of barrier layer 212, openings 228 may be at or closer to a target critical dimension and/or may have a more consistent critical dimension (e.g., less or no variation between different openings 228).

In certain embodiments, portions of photoresist layer 210 may be removed in a wet process by treating semiconductor workpiece 200 with a developer solution to dissolve the reacted (exposed regions 218), in the case of a positive tone resist, or unreacted (unexposed regions 220), in the case of a negative tone resist, regions of photoresist layer 210. The appropriate developer solution for removing portions of photoresist layer 210 depends in part on the material of photoresist layer 210. In certain embodiments, the developer solution may include an aqueous alkaline solution that includes a water-soluble organic base.

Alternatively, a dry process may be used in other embodiments. The dry process may include, for example, a selective plasma etch process or a thermal process, which may eliminate the use of a developing solution. In certain embodiments, the dry process may be performed using reactive ion etching (RIE) process or atomic layer etching (ALE).

As illustrated in FIG. 2F, the developing phase also includes removing barrier layer 212 from photoresist layer 210. For example, barrier layer 212 may be removed from both exposed regions 218 and unexposed regions 220 of barrier layer 212. In this example, the process/chemistry that is used to develop photoresist layer 210 (e.g., to remove exposed regions 218) also may be capable of removing the material of barrier layer 212. An example in which barrier layer 212 is removed from photoresist layer 210 prior to developing photoresist layer 210 is described below with reference to FIGS. 5A-5F. This disclosure contemplates performing the development phase using any suitable process/chemistry.

For example, development of photoresist layer 210 (e.g., to remove exposed regions 218 and potentially the material of barrier layer 212) may be performed using an organic solvent. Potential example organic solvents may include propylene glycol methyl ether acetate (PGMEA), 2-Heptanone, isopropyl alcohol (IPA), 2-Pentanone, or another suitable organic solvent. In one example, the solvent dispense volume may be between 5 ml to 500 ml, for example 10 ml to 100 ml. The substrate (e.g., workpiece 200) may be secured to a rotating chuck that supports the substrate. The rotating speed during liquid dispense can be between 50 rpm to 3000 rpm, for example 1000 rpm to 2000 rpm. Although organic solvents are primarily described, this disclosure contemplates using any suitable solvent.

As another example, development of photoresist layer 210 (e.g., to remove exposed regions 218 and potentially the material of barrier layer 212) may be performed in a gas phase with or without plasma. Example gases for such a gas phase may include hydrobromic acid (HBr), boron trichloride (BCL3), or another suitable gas/gas combination.

FIGS. 3A-3E illustrate cross-sectional views of an example semiconductor workpiece 300 during an example patterning process 302, according to certain embodiments. In the example illustrated FIGS. 3A-3E, a barrier layer 312 is deposited on photoresist layer 310 prior to photoresist layer 310 being exposed to actinic radiation.

Figure 3A:
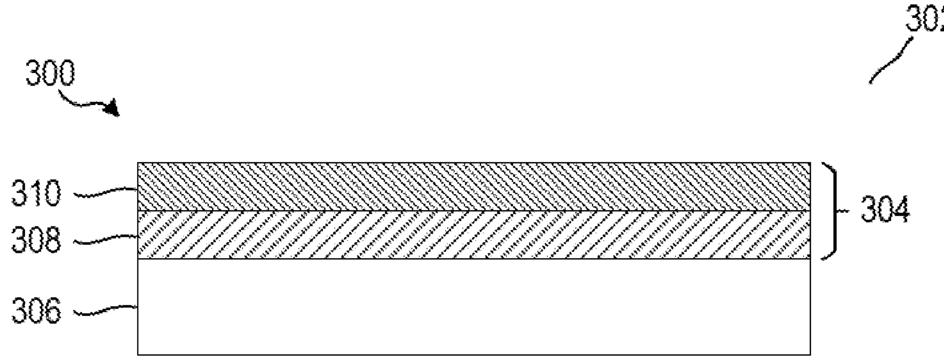
FIGS. 3A-3E illustrate cross-sectional views of an example semiconductor workpiece during an example patterning process, according to certain embodiments.

As shown in FIG. 3A, and as similarly described above with reference to FIG. 2A, a layer stack 304 may be formed on a substrate 306. In this example, layer stack 304 includes photoresist layer 310.

Figure 3B:
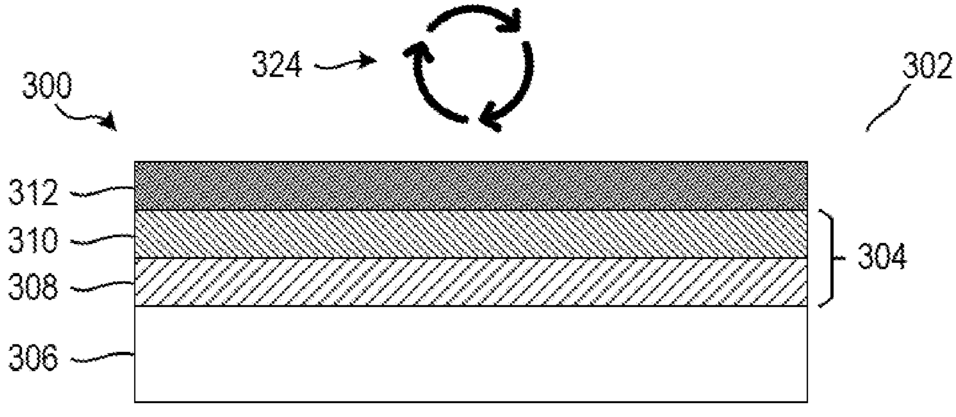

As illustrated in FIG. 3B, barrier layer 312 may be deposited on layer stack 304 (e.g., on photoresist layer 310) using a suitable deposition technique. In certain embodiments, barrier layer 212 is deposited on photoresist layer 110 using a spin-on deposition technique 324. Spin-on deposition technique 324 may be similar to spin-on deposition technique 224, the description of which is incorporated by reference. Additionally or alternatively, barrier layer 212 may be deposited using a CVD or other suitable process.

In embodiments such as the one illustrated in FIGS. 3A-3E in which barrier layer 312 is deposited prior to exposure of photoresist layer 310 to actinic radiation, the material of barrier layer 312 may be relatively transparent to actinic radiation, such as 13 nm radiation or 193 nm radiation, so that photoresist layer 310 can be patterned, as desired.

In certain embodiments, depending on the configuration and capabilities of the apparatuses involved, deposition of barrier layer 312 may be performed in a same deposition module (e.g., a spin-on deposition module) of the track system as was used to deposit photoresist layer 310 or in a separate deposition module of the track system than the one used to deposit photoresist layer 310. Alternatively, semiconductor workpiece 300 may be transferred from the track system to another deposition system for depositing barrier layer 312.

Figure 3C:
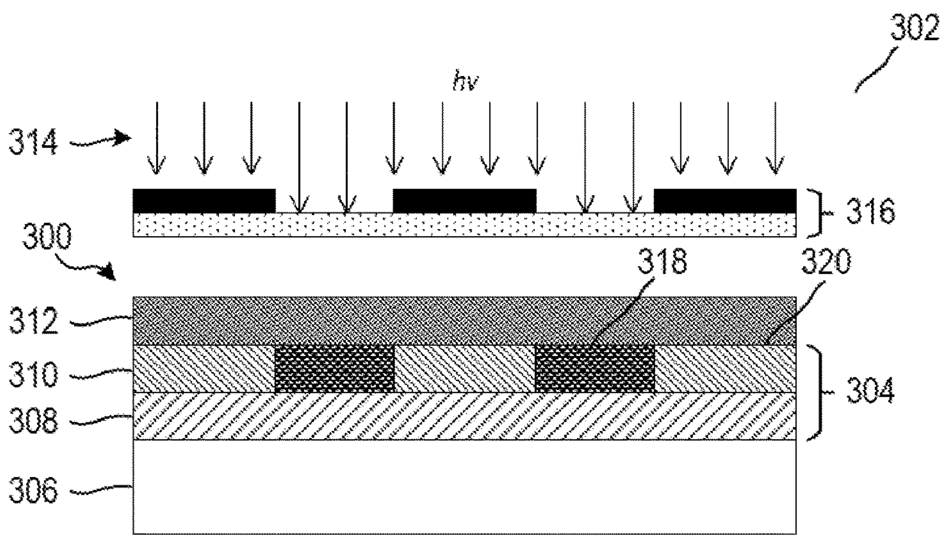

As illustrated in FIG. 3C, in an exposure phase, photoresist layer 310 is exposed to a pattern of actinic radiation 314 to form a pattern in photoresist layer 310. For example, actinic radiation 314 may be directed toward semiconductor workpiece 300, and particularly to a surface of photoresist layer 310, through a patterned mask 316 to cause a target pattern to form in photoresist layer 310. The target pattern may include exposed regions 318 and unexposed regions 320, the characteristics of which may depend on whether a positive or negative photoresist layer 310 is used, as described above.

In the example of FIGS. 3A-3E, barrier layer 312 has been deposited on photoresist layer 310 prior to photoresist layer 310 being irradiated. It may be appropriate for the material selected for barrier layer 312 to be relatively transparent to actinic radiation 314, so that suitable regions of photoresist layer 310 (e.g., exposed regions 318) may be exposed to actinic radiation 314 through barrier layer 312 according to a pattern defined by pattern mask 316. In certain embodiments, the material selected for barrier layer 312 being relatively transparent to actinic radiation 314 includes the material selected for barrier layer 312 being sufficiently transparent to actinic radiation 314 such that suitable regions of photoresist layer 310 (e.g., exposed regions 318) may be exposed to actinic radiation 314 through barrier layer 312 (e.g., according to a pattern defined by pattern mask 316). Furthermore, while being relatively transparent to actinic radiation, the material selected for barrier layer 312 also is selected to perform the role of a barrier layer, such as having sufficiently low water permeability, as described above. As just one example, a material that may be suitable for barrier layer 312 may include polynorbornene, which possesses low 13 nm absorbance and low water permeability.

In certain embodiments, it may be appropriate to increase the dosage of radiation by an appropriate amount (e.g., relative to an example in which a barrier layer is deposited after exposure) during an exposure phase to promote exposure of suitable regions of photoresist layer 310 (e.g., exposed regions 318) to actinic radiation 314 through barrier layer 312 (e.g., according to a pattern defined by pattern mask 316), possibly depending on the transparency of the material of barrier layer 312 relative to the actinic radiation.

Figure 3D:
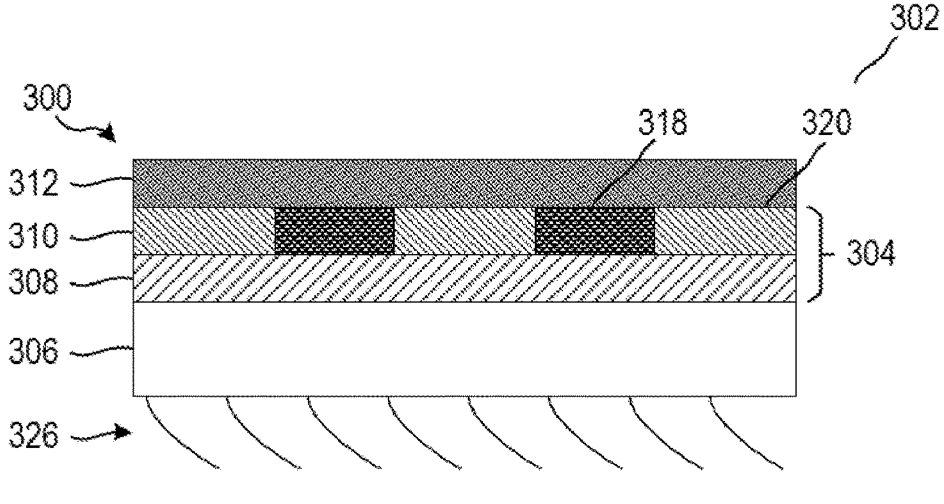

As illustrated in FIG. 3D, a PEB 326 may be performed, which may further differentiate the material properties between exposed regions 318 and unexposed regions 320. PEB 326 may be similar to those described above for patterning process 202.

Figure 3E:
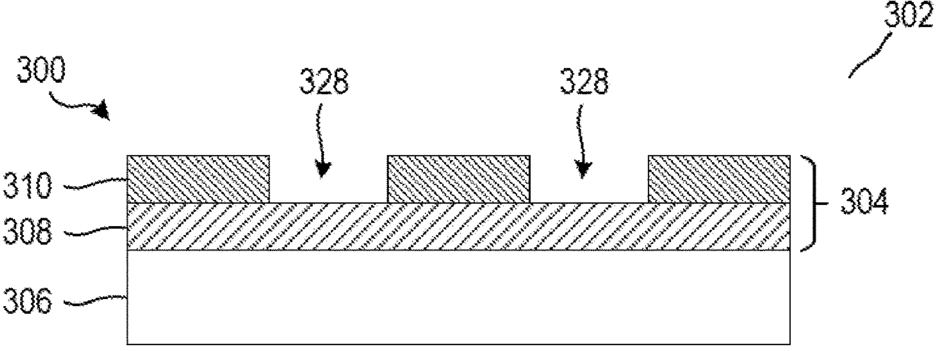

As illustrated in FIG. 3E, in a developing phase, photoresist layer 310 may be developed using a suitable development process. During the developing phase, and according to the illustrated example of a positive photolithography process, exposed regions 318 of photoresist layer 310 may be removed using a suitable dry etch or wet etch process, and thereby forming photoresist layer 310 into a mask according to pattern mask 316 that can then be used to etch underlying layer 308, if desired. For example, the developing phase may form openings 328 in photoresist layer 310. Openings 328 in photoresist layer 310 may be used in an etching process to etch features in underlying layer 308. As described above, portions of photoresist layer 310 may be removed using any suitable type of process, including a wet or dry process.

As illustrated in FIG. 3E, the developing phase also includes removing barrier layer 312 from photoresist layer 310. For example, barrier layer 312 may be removed from both exposed regions 318 and unexposed regions 320 of barrier layer 312. In this example, the process/chemistry that is used to develop photoresist layer 310 (e.g., to remove exposed regions 318) also may be capable of removing the material of barrier layer 312 to thereby remove barrier layer 312. Barrier layer 312 could be removed at other suitable times using other suitable processes, however. For example, barrier layer 312 could be removed in a separate step using a separate removal technique/chemistry prior to developing photoresist layer 310, if desired.

FIGS. 4A-4E illustrate cross-sectional views of an example semiconductor workpiece 400 during an example patterning process 402, according to certain embodiments. In particular, FIGS. 4A-4E illustrate an example in which a photoresist layer 410 and barrier layer 412 are deposited differently than in the examples of patterning processes 202 and 302.

Figure 4A:
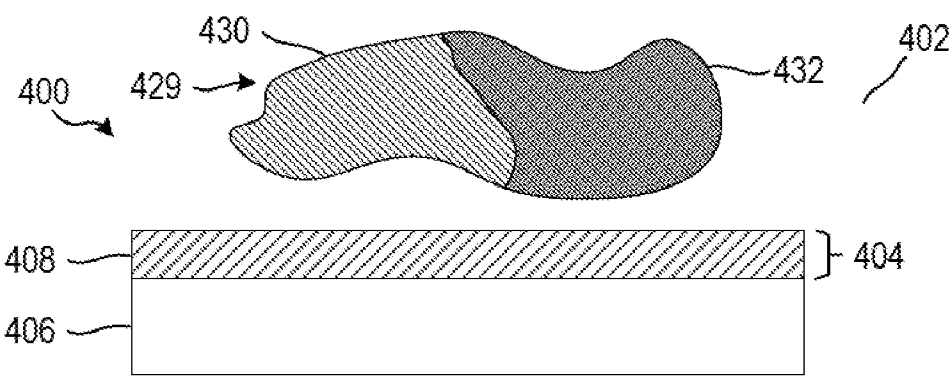
FIGS. 4A-4E illustrate cross-sectional views of an example semiconductor workpiece during an example patterning process, according to certain embodiments.

As illustrated in FIG. 4A, a layer stack 404 may be formed on a substrate 406. In this example, at this stage layer stack 404 includes underlying layer 408, with a photoresist layer yet to be formed. Instead, a photoresist layer 410 and a barrier layer 412 are formed substantially simultaneously as part of depositing a photoresist formula 429.

In particular, a photoresist formula 429 may be selected that includes both photoresist components 430 and barrier layer components 432. For example, photoresist components 430 and barrier layer components 432 may be dissolved in a solution together to form photoresist formula 429, which may, in part, drive selection of particular photoresist components 430, barrier layer components 432, and solvents. Photoresist formula 429 may be designed such that photoresist components 430 and barrier layer components 432 self-segregate when deposited on a surface of layer stack 404 (e.g., on a surface of underlying layer 408). Furthermore, as described in greater detail below, because in example patterning process 402 a barrier layer 412 will be formed over a photoresist layer 410 prior to exposure (irradiation) of photoresist layer 410, it may be appropriate for barrier layer 412 to be relatively transparent to the actinic radiation that will be used to irradiate a portion of photoresist layer 410. This additional consideration also may affect selection of materials for barrier layer components 432, for example.

As just one example, barrier layer components 432 may include one or more fluorinated polymers in a blend to provide self-segregating materials for immersion lithography. As a particular example, photoresist formula 429 may include fluorinated polynorbornenes (as barrier layer components 432) blended with polymeric chemically-amplified resists (e.g., photoresist components 430) dissolved in polar organic solvents (e.g., PGMEA), and could be used to form segregated films of photoresist layer 410 and barrier layer 412. These materials are provided as examples only.

It should be noted that the clear separation of photoresist components 430 and barrier layer components 432, as well as the relative amounts of each, shown in FIG. 4A is for ease of illustration only. Photoresist components 430 and barrier layer components 432 may be dispersed throughout photoresist formula 429, and the relative amounts of photoresist components 430 and barrier layer components 432 may be tailored to achieve a desired result.

Figure 4B:
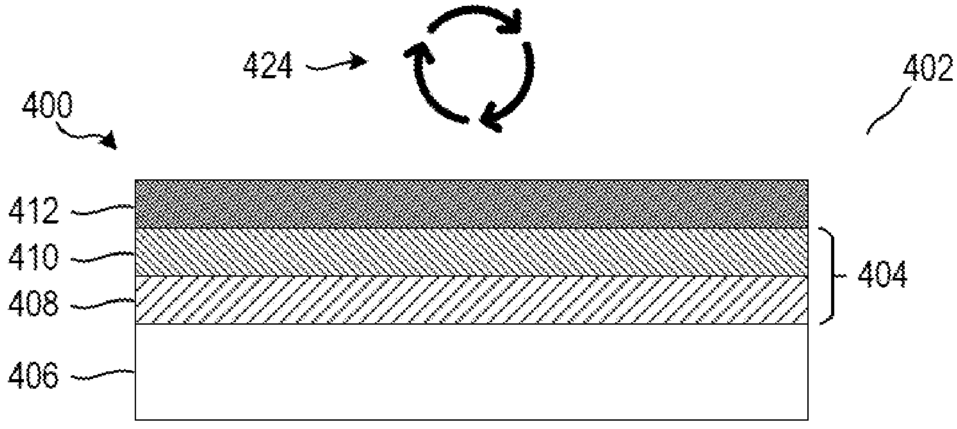

As illustrated in FIG. 4B, photoresist formula 429 may be deposited on a surface of layer stack 404 (e.g., on a surface of underlying layer 408). For example, photoresist formula 429 may be deposited such that photoresist components 430 and barrier layer components 432 self-segregate on a surface of layer stack 404 (e.g., on a surface of underlying layer 408).

This disclosure contemplates using any suitable deposition technique to deposit photoresist formula 429 that results in separation of photoresist components 430 and barrier layer components 432, with photoresist components 430 forming photoresist layer 410 on underlying layer 408 and barrier layer components 432 forming barrier layer 412 on photoresist layer 410.

In certain embodiments, a spin-coating technique 424 may be used to deposit photoresist formula 429 to form photoresist layer 410 and barrier layer 412. For example, a spin-coating technique 424 may cause photoresist components 430 and barrier layer components 432 to segregate (or self-segregate), with photoresist components 430 forming photoresist layer 410 on underlying layer 408 and barrier layer components 432 forming barrier layer 412 on photoresist layer 410. As a more particular example, a spin-coating technique 424 may cause photoresist components 430 to be deposited on underlying layer 408 to form photoresist layer 410, while the spin-coating technique 424 causes barrier layer components 432 to rise to the top and form barrier layer 412 on photoresist layer 410. For example, during the spin-coating process (including associated process conditions, such as temperature and spin-rate), photoresist components 430 may be attracted to the surface materials of underlying layer 408 while barrier layer components 432 may be attracted to the environment above semiconductor workpiece 400 (e.g., air), resulting in separation of photoresist components 430 and barrier layer components 432 into photoresist layer 410 and barrier layer 412. This may be particularly true during the early stages of the spin coating process, when mobility of molecules may be particularly high, though the separation could occur at any suitable time.

Thus, in certain embodiments, a single deposition (e.g., a single liquid spin-on deposition) may result in barrier layer 412 formed on photoresist layer 410.

Spin-on deposition technique 424 may be similar to spin-on deposition technique 224, the description of which is incorporated by reference. In certain embodiments, a post deposition bake may be performed, which may further facilitate separation of photoresist components 430 and barrier layer components 432 into photoresist layer 410 and barrier layer 412.

In certain embodiments, deposition of photoresist formula 429 to vertically separate photoresist components 430 and barrier layer components 432 into photoresist layer 410 and barrier layer 412 may be performed in a deposition module (e.g., a spin-coating module) of a larger track system for a lithography process, an example of which is described in greater detail below with reference to FIG. 12. It should be understood, however, that photoresist layer 210 may be deposited using any suitable process.

Figure 4C:
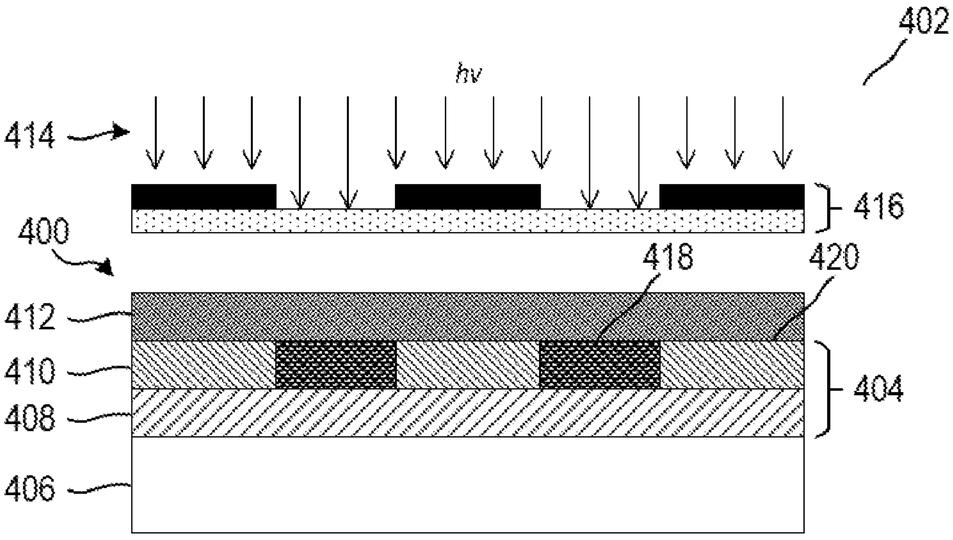
Figure 4D:
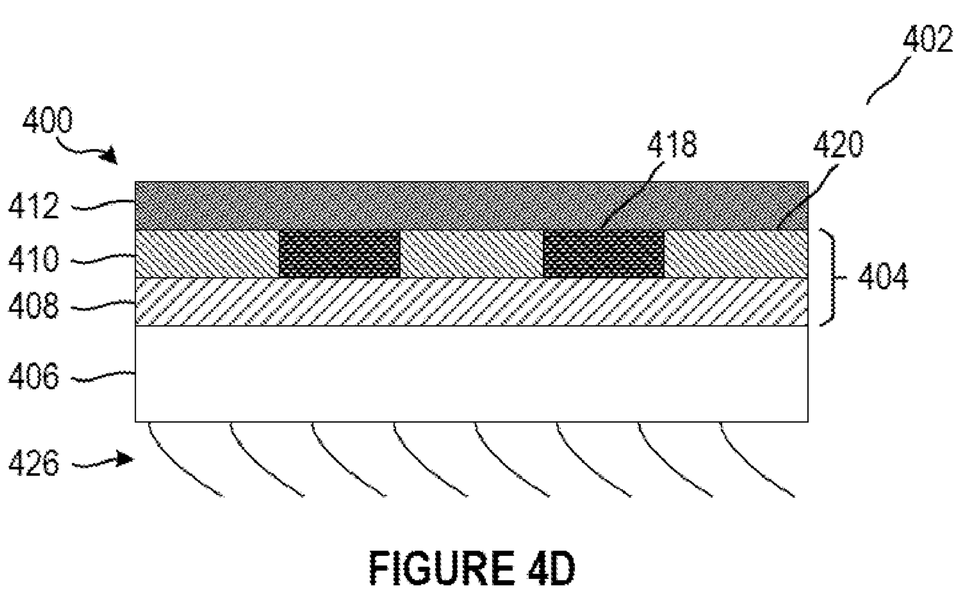
Figure 4E:
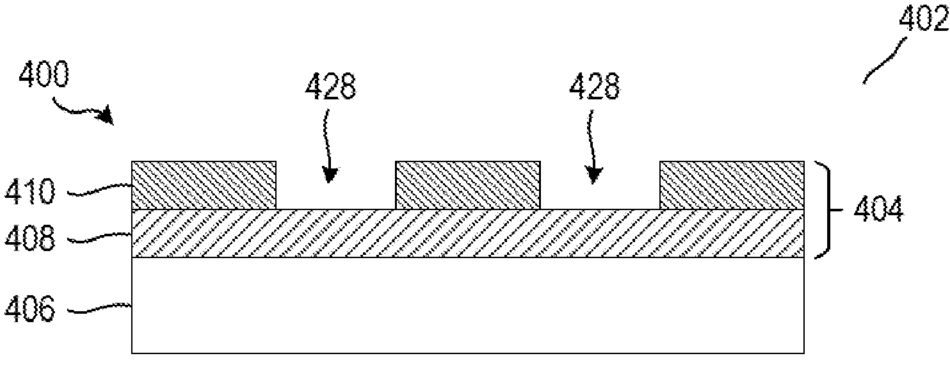

FIG. 4C illustrates an example exposure phase for processing semiconductor workpiece 400, FIG. 4D illustrates an example PEB phase (using a PEB 426), and FIG. 4E illustrates an example development phase for processing semiconductor workpiece 400, and may generally correspond to, for example, FIG. 2B (or 3C), FIG. 2E (or 3D), and FIG. 2F (or 3E), respectively, the descriptions of which are incorporated by reference.

In patterning process 402, barrier layer 412 has been deposited on photoresist layer 410 prior to photoresist layer 410 being irradiated. It may be appropriate for the material selected for barrier layer 412 to be relatively transparent to actinic radiation 414, so that suitable regions of photoresist layer 410 (e.g., exposed regions 418) may be exposed to actinic radiation 414 through barrier layer 412 according to a pattern defined by pattern mask 416. Additionally, while being relatively transparent to actinic radiation, the material selected for barrier layer 412 also is selected to perform the role of a barrier layer, such as having sufficiently low water permeability, as described above. Furthermore, within the context of patterning process 402, the material selected for barrier layer components 432 is capable of separating from a mixture with photoresist components 430 in photoresist formula 429 to form barrier layer 412. The materials described above for photoresist formula 429, photoresist components 430, and barrier layer components 432 may be capable of providing a photoresist layer 410 and/or barrier layer 412 that possess suitable ones of these properties.

As an example variation on patterning process 402, an exposure step may be performed prior to separating photoresist formula 429 into photoresist layer 410 and barrier layer 412. For example, photoresist formula 429 may be deposited on the wafer (e.g., on underlying layer 408) using a suitable technique (e.g., spin-on deposition). In such an example, the spin-on deposition may be insufficient to completely separate photoresist components 430 and barrier layer components 432 into photoresist layer 410 and barrier layer 412, respectively. In this state, semiconductor workpiece 400 may be exposed to pattern of actinic radiation 414. Subsequent to exposure, semiconductor workpiece 400 may be heated in a first heating step prior to executing the PEB 426 of FIG. 4D, and this first heating step may facilitate photoresist components 430 and barrier layer components 432 separating into photoresist layer 410 and barrier layer 412. Subsequently, PEB 426 may be executed and then patterning process 402 may proceed as shown in and described with reference to FIG. 4E.

FIGS. 5A-5F illustrate cross-sectional views of an example semiconductor workpiece 500 during an example patterning process 502, according to certain embodiments. Patterning process 502 generally corresponds to patterning process 202, except that rather than removing a barrier layer as part of developing a photoresist layer (e.g., removing barrier layer 212 as part of developing photoresist layer 210, as shown in FIG. 2E), with patterning process 502 a barrier layer 512 is removed (e.g., stripped) prior to development of a photoresist layer 510 on which barrier layer 512 is deposited.

Figure 5A:
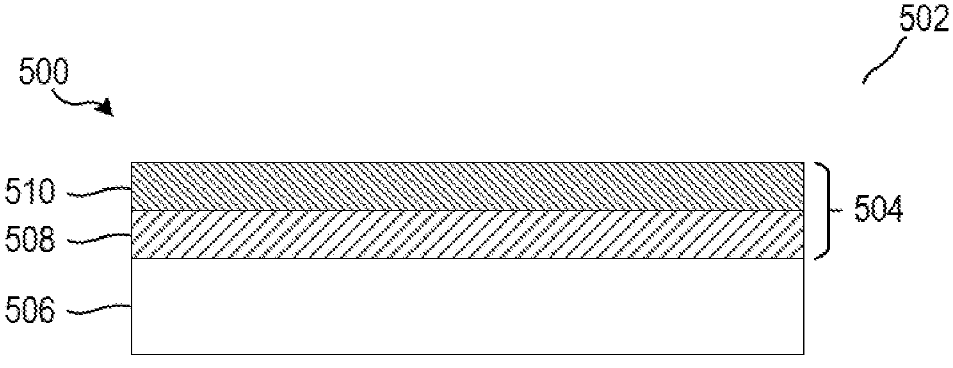
FIGS. 5A-5F illustrate cross-sectional views of an example semiconductor workpiece during an example patterning process, according to certain embodiments.
Figure 5B:
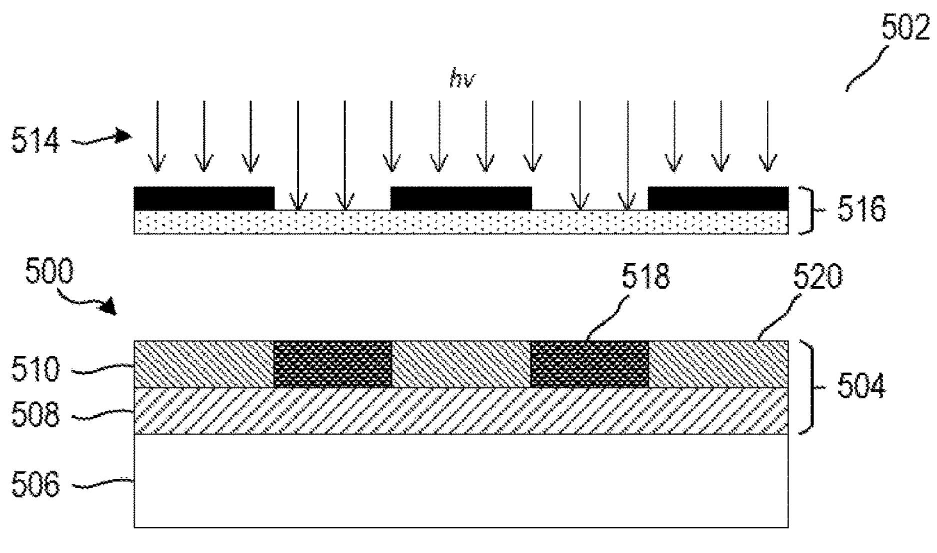
Figure 5C:
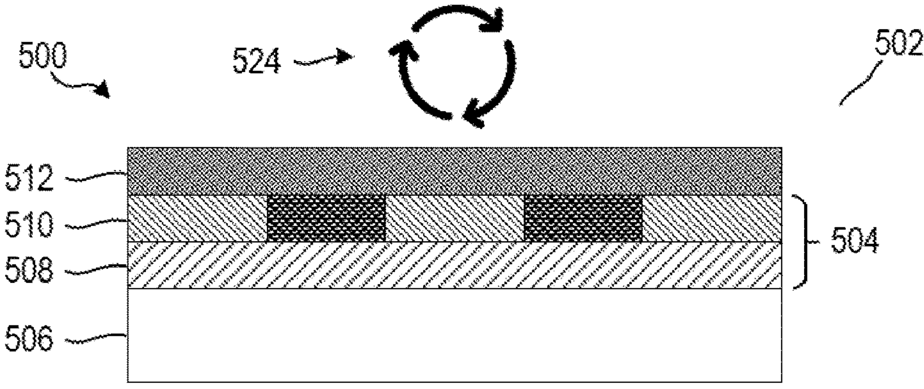

In particular, the phases of patterning process 502 illustrated in FIGS. 5A, 5B, 5C, and 5D generally correspond to phases of patterning process 202 illustrated in FIGURES FIGS. 2A, 2B, 2D, and 2E, respectively, the descriptions of which are incorporated by reference. Although not shown in a separate figure for patterning process 502, a liquid rinse similar to the optional liquid rinse 222 of patterning process 202 (FIG. 2C) may be performed between exposure (FIG. 5B) and deposition of barrier layer 512 (FIG. 5C).

Figure 5D:
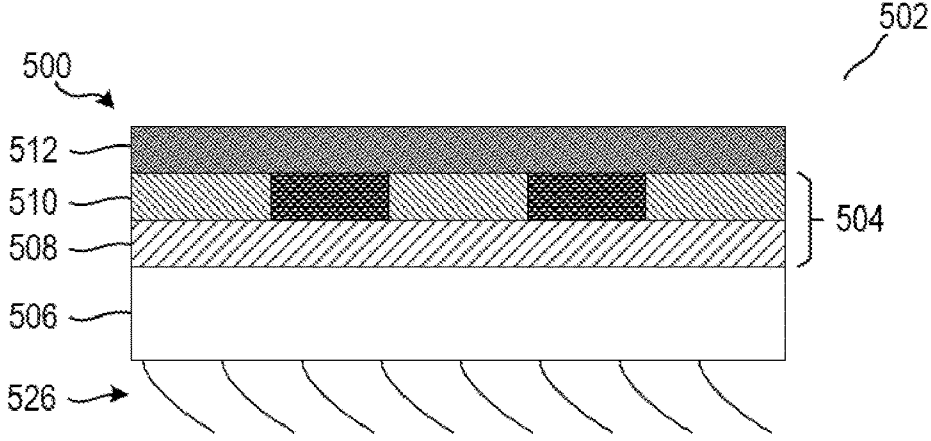

As illustrated in FIG. 5D, subsequent to a PEB 526 of semiconductor workpiece 500 and prior to development of photoresist layer 510, barrier layer 512 may be removed using a suitable removal technique. For example, barrier layer 512 may be removed using a dry etch process or a wet etch process. Removing barrier layer 512 using a separate process from removal of portions of photoresist layer 510 may allow additional materials to be used for barrier layer 512 even though those materials are not compatible for removal by the developer solution (or other removal technique) to be used for removing portions of photoresist layer 510.

The particular removal process and, if applicable, solution for removing (stripping) barrier layer 512 prior to developing photoresist layer 510 without removing or otherwise adversely affecting photoresist layer 510 may depend on the materials of barrier layer 512 and photoresist layer 510.

Figure 5E:
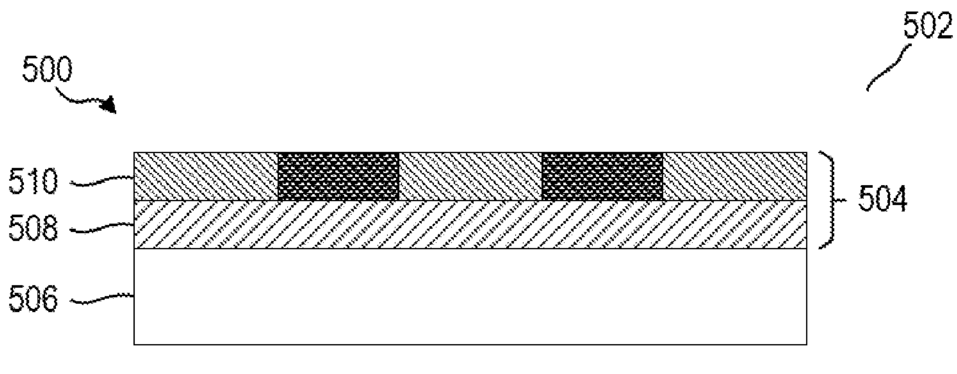
Figure 5F:
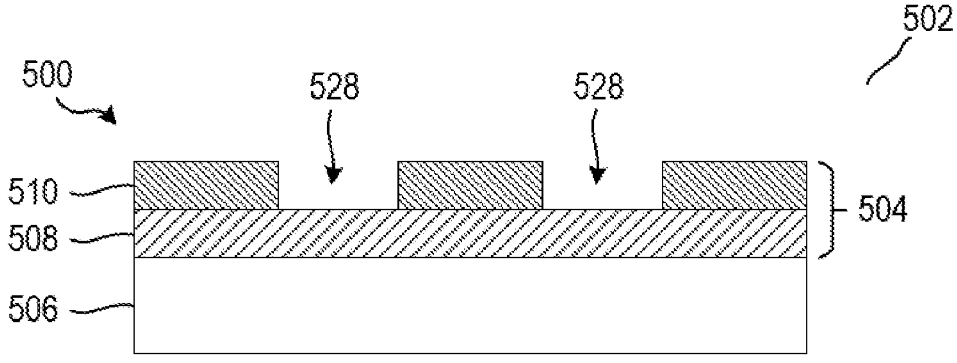

As illustrated in FIG. 5E, subsequent to removal of barrier layer 512, in a developing phase, photoresist layer 510 may be developed. During the developing phase, and according to the illustrated example of a positive photolithography process, exposed regions 518 of photoresist layer 510 may be removed using a suitable dry etch or wet etch process, thereby forming photoresist layer 510 into a mask according to pattern mask 516 that can then be used to etch underlying layer 508, if desired. For example, the developing phase may form openings 528 in photoresist layer 510. Openings 528 in photoresist layer 510 may be used in an etching process to etch features in underlying layer 508.

While patterning process 502 is an example in which semiconductor workpiece 500 is processed in a manner similar to that described above with reference to patterning process 202, a barrier layer (e.g., barrier layer 512) may be removed prior to developing a photoresist layer (e.g., photoresist layer 510) in combination with any suitable patterning process.

FIGS. 6A-6E and 7A-7E illustrate example patterning processes in which a barrier layer is deposited on a photoresist layer using a vapor-phase deposition technique rather than a spin-on deposition technique, with the deposition being performed either after exposure of the photoresist layer to actinic radiation (FIGS. 6A-6E) or before exposure of the photoresist layer to actinic radiation (FIGS. 7A-7E).

FIGS. 6A-6E illustrate cross-sectional views of an example semiconductor workpiece 600 during an example patterning process 602, according to certain embodiments. According to patterning process 602, a barrier layer is deposited on a photoresist layer using a vapor-phase deposition technique, with the deposition being performed after exposure of the photoresist layer to actinic radiation.

Figure 6A:
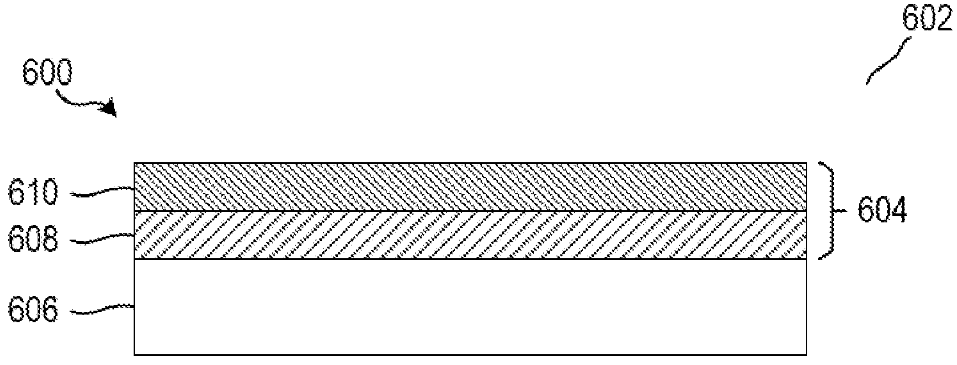
FIGS. 6A-6E illustrate cross-sectional views of an example semiconductor workpiece during an example patterning process, according to certain embodiments.

As illustrated in FIG. 6A, a layer stack 604 may be formed on a substrate 606. In this example, layer stack 604 includes photoresist layer 610.

Figure 6B:
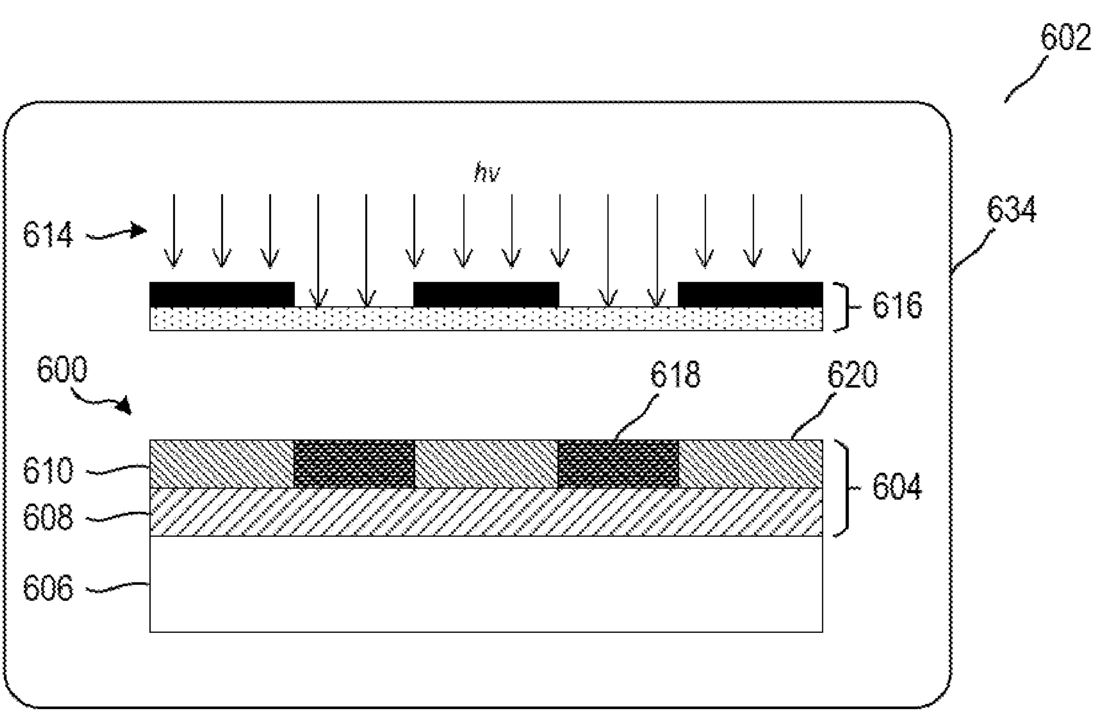

As illustrated in FIG. 6B, photoresist layer 610 is exposed to a pattern of actinic radiation 614 (is irradiated) to form a pattern in photoresist layer 610. For example, actinic radiation 614 may be directed toward semiconductor workpiece 600, and particularly to a surface of photoresist layer 610, through a patterned mask 616 to cause a target pattern to form in photoresist layer 610. The target pattern may include exposed regions 618 and unexposed regions 620. For purposes of this example, it will be assumed that a positive photoresist is used.

In certain embodiments, exposure of photoresist layer 610 to the pattern of actinic radiation is performed in a vacuum chamber 634 of a processing tool. This disclosure, however, contemplates exposure of photoresist layer 610 to the pattern of actinic radiation being performed in vacuum or out of vacuum. Whether performed in vacuum or out of vacuum, in certain embodiments, semiconductor workpiece 600 is transferred from a track system that includes a module for depositing photoresist layer 610 to an exposure module for exposing photoresist layer 610 to the pattern of actinic radiation 614 (see, e.g., FIG. 12).

Figure 6C:
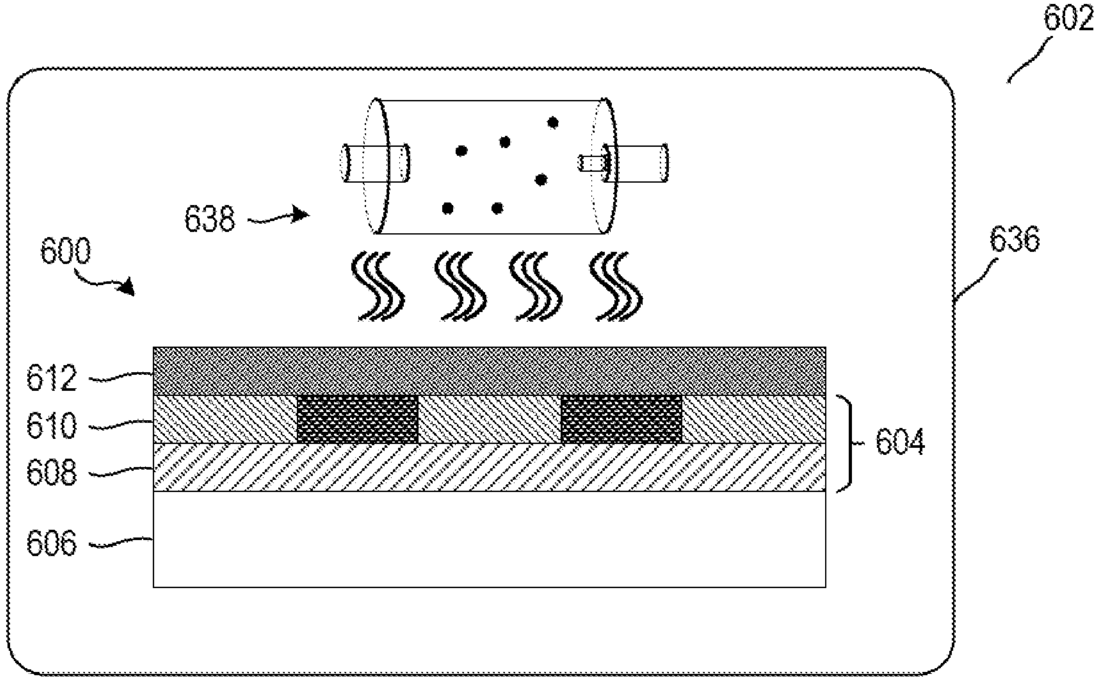

As illustrated in FIG. 6C, subsequent to exposing photoresist layer 610 to the pattern of actinic radiation, barrier layer 612 is deposited on photoresist layer 610 (as patterned) using a vapor-phase deposition process 638. Vapor-phase deposition process 638 may include a gas phase exposure. Vapor-phase deposition process 638 may include any suitable type of vapor-phase deposition process, including a physical vapor deposition (PVD) process, a CVD process, or an ALD process, as well as other plasma processes such as plasma enhanced CVD (PECVD), sputtering, and other processes.

In certain embodiments, the material of the generated vapor and resulting barrier layer 612 has properties that will allow the resulting barrier layer 612 to reduce or eliminate environmental impacts on photoresist processing. For example, the material of the generated vapor and resulting barrier layer 612 may be hydrophobic (e.g., have a high static water contact angle) or otherwise have low water vapor permeability.

In certain embodiments, depositing barrier layer 612 on photoresist layer 610 using vapor-phase deposition process 638 is performed in a vacuum chamber 636 of a processing tool. This disclosure, however, contemplates depositing barrier layer 612 on photoresist layer 610 using vapor-phase deposition process 638 being performed in vacuum or out of vacuum. Vacuum chambers 634 and 636 may be the same or different vacuum chambers and/or may be a part the same or different processing tool. In certain embodiments, using a same vacuum chamber may allow semiconductor workpiece 600 to be processed in a continuous vacuum at both stages without being exposed to the atmosphere.

Whether performed in vacuum or out of vacuum, in certain embodiments, an additional transfer of semiconductor workpiece 600 might or might not be performed. For example, if exposure (FIG. 6B) and barrier layer deposition (FIG. 6C) are performed in a same vacuum chamber, an additional transfer might not be performed; however, if exposure and barrier layer deposition are performed in separate chambers, semiconductor workpiece 600 may be transferred to a different chamber between exposure and barrier layer deposition.

Figure 6D:
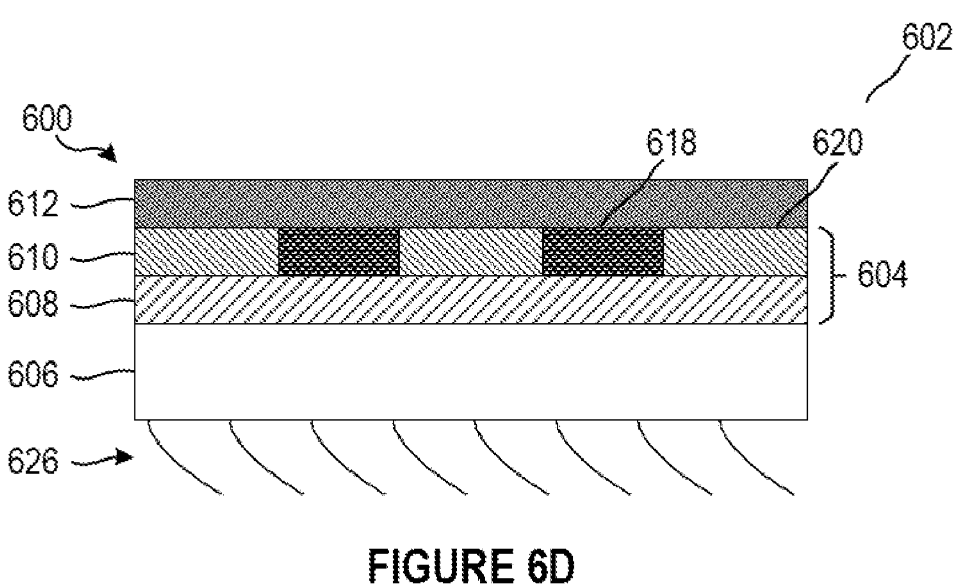
Figure 6E:
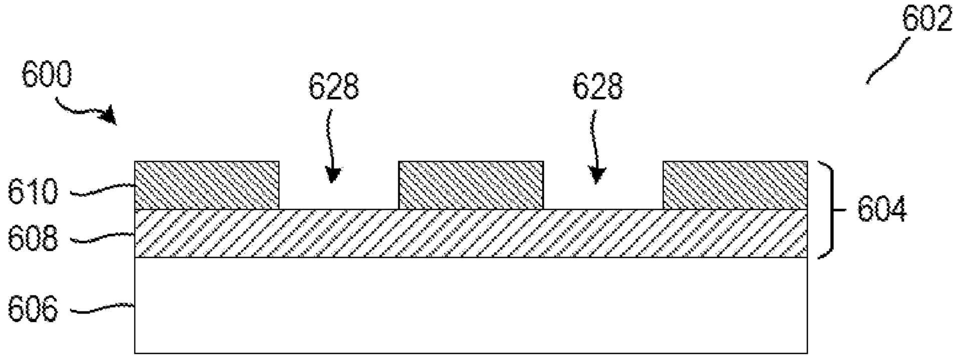

FIG. 6D illustrates an example PEB phase (using a PEB 626) and FIG. 6E illustrates an example development phase for processing semiconductor workpiece 600, and may generally correspond to, for example, FIG. 2E and FIG. 2F, respectively, the descriptions of which are incorporated by reference.

FIGS. 7A-7E illustrate cross-sectional views of an example semiconductor workpiece 700 during an example patterning process 702, according to certain embodiments. According to patterning process 702, a barrier layer is deposited on a photoresist layer using a vapor-phase deposition technique, with the deposition being performed prior to exposure of the photoresist layer to actinic radiation.

Figure 7A:
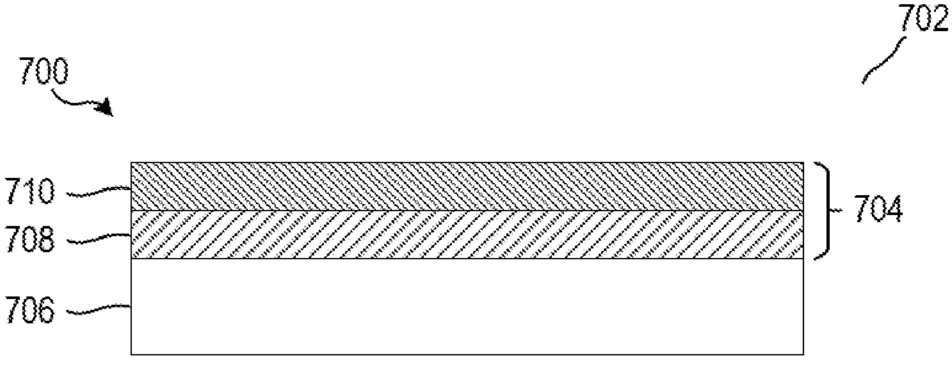
FIGS. 7A-7E illustrate cross-sectional views of an example semiconductor workpiece during an example patterning process, according to certain embodiments.

As illustrated in FIG. 7A, a layer stack 704 may be formed on a substrate 706. In this example, layer stack 704 includes photoresist layer 710.

Figure 7B:
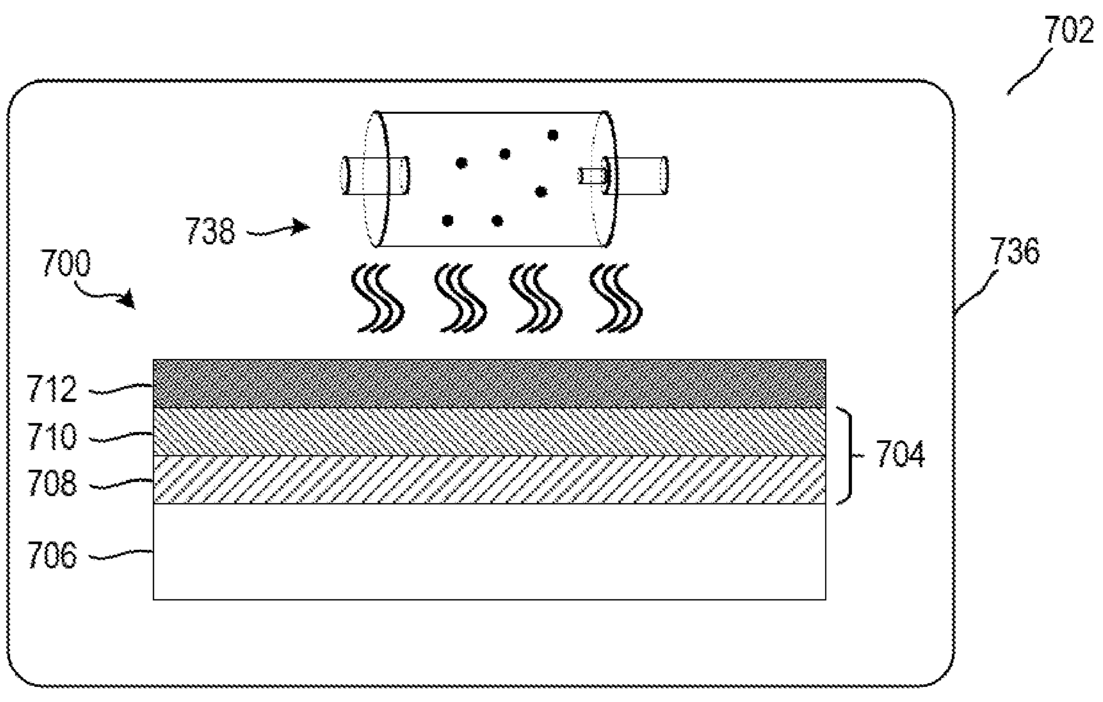

As illustrated in FIG. 7B, prior to exposing photoresist layer 710 to a pattern of actinic radiation, barrier layer 712 is deposited on photoresist layer 710 using a vapor-phase deposition process 738. Vapor-phase deposition process 738 may include any suitable type of vapor-phase deposition process, including a physical vapor deposition process, a CVD process, a plasma process (e.g., a PECVD process), an ALD process, or the like.

In certain embodiments, depositing barrier layer 712 on photoresist layer 710 using vapor-phase deposition process 738 is performed in a vacuum chamber 736 of a processing tool. This disclosure, however, contemplates depositing barrier layer 712 on photoresist layer 710 using vapor-phase deposition process 738 being performed in vacuum or out of vacuum. Whether performed in vacuum or out of vacuum, in certain embodiments, semiconductor workpiece 700 is transferred from a track system that includes a module for depositing photoresist layer 710 to vapor-phase deposition tool for depositing using a vapor-phase deposition process 738 barrier layer 712 on photoresist layer 710. Alternatively, it may be possible to implement a vapor-deposition tool as part of the track system.

Figure 7C:
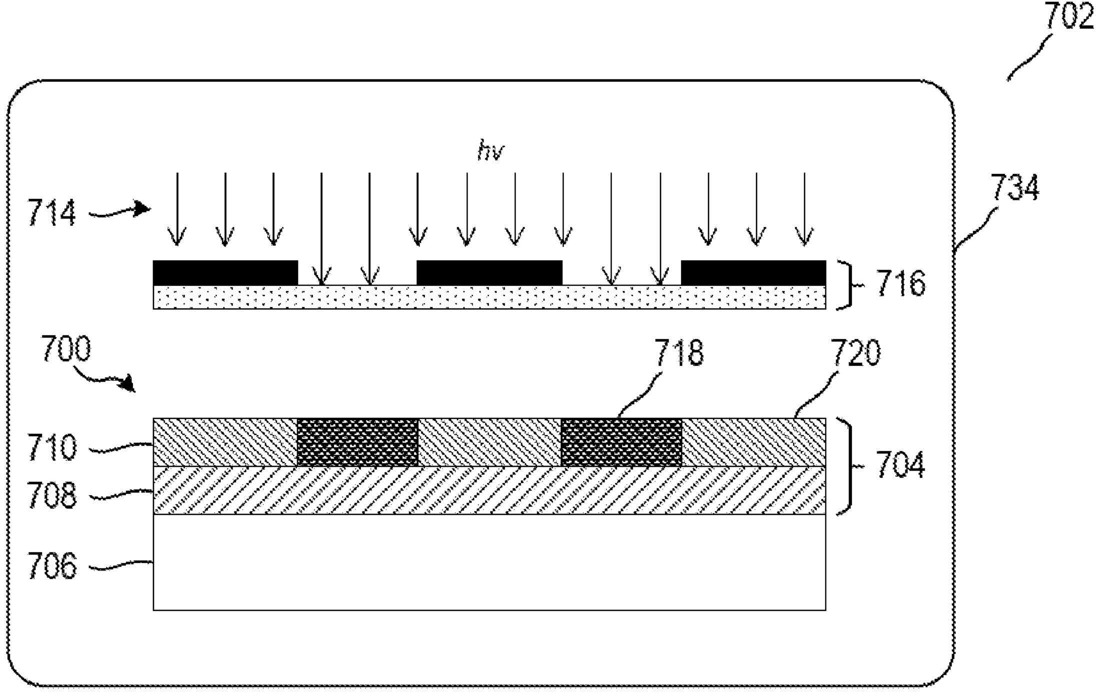

As illustrated in FIG. 7C, subsequent to depositing barrier layer 712 on photoresist layer 710, photoresist layer 710 is exposed to a pattern of actinic radiation 714 (is irradiated) to form a pattern in photoresist layer 710. For example, actinic radiation 714 may be directed toward semiconductor workpiece 700, and particularly to a surface of photoresist layer 710, through a patterned mask 716 to cause a target pattern to form in photoresist layer 710. The target pattern may include exposed regions 718 and unexposed regions 720. For purposes of this example, it will be assumed that a positive photoresist is used.

The material selected for barrier layer 712 is selected to be relatively transparent to actinic radiation 714, so that suitable regions of photoresist layer 710 (e.g., exposed regions 718) may be exposed to actinic radiation 714 through barrier layer 712 according to a pattern defined by pattern mask 716. Furthermore, the material selected for barrier layer 712 also is selected to perform the role of a barrier layer, as described above.

In certain embodiments, exposure of photoresist layer 710 to the pattern of actinic radiation 714 is performed in a vacuum chamber 734 of a processing tool. This disclosure, however, contemplates exposure of photoresist layer 710 to the pattern of actinic radiation 714 being performed in vacuum or out of vacuum. Vacuum chambers 734 and 736 may be the same or different vacuum chambers and/or may be a part the same or different processing tool.

Whether performed in vacuum or out of vacuum, in certain embodiments, an additional transfer of semiconductor workpiece 700 might or might not be performed. For example, if barrier layer deposition (FIG. 7B) and exposure (FIG. 7C) are performed in a same vacuum chamber, an additional transfer might not be performed; however, if barrier layer deposition and exposure are performed in separate chambers, semiconductor workpiece 700 may be transferred to a different chamber between barrier layer deposition and exposure.

Figure 7D:
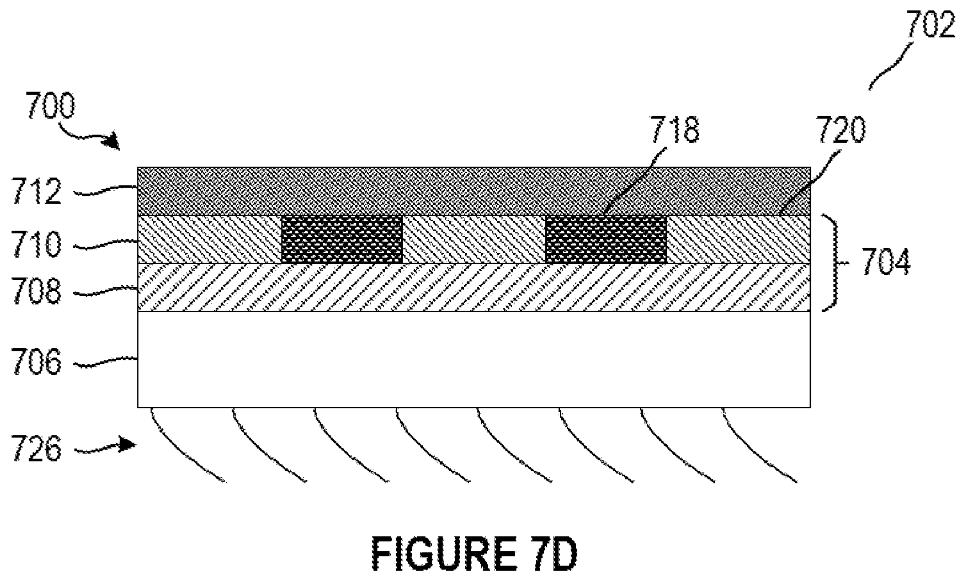
Figure 7E:
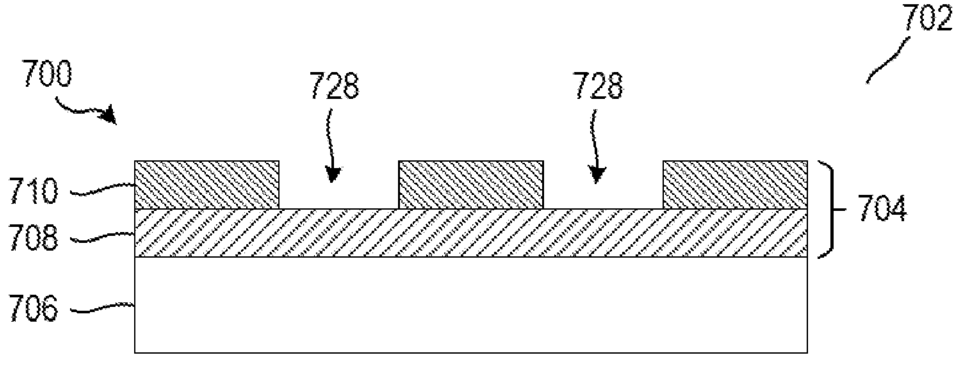

FIG. 7D illustrates an example PEB phase (using a PEB 726) and FIG. 7E illustrates an example development phase for processing semiconductor workpiece 700, and may generally correspond to, for example, FIG. 2E and FIG. 2F, respectively, the descriptions of which are incorporated by reference.

Figure 8:
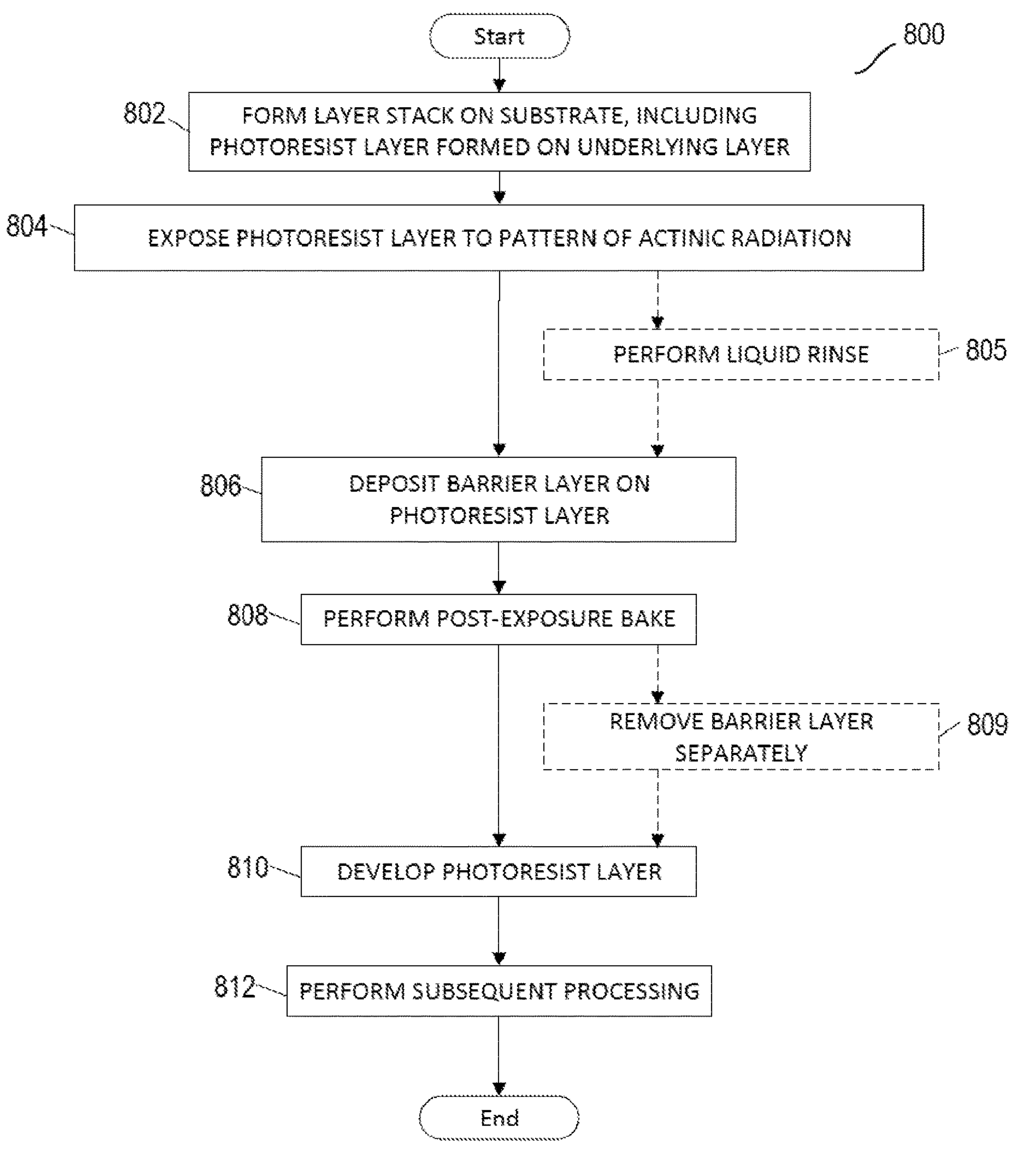
FIG. 8 illustrates an example method for patterning a semiconductor workpiece, according to certain embodiments.

FIG. 8 illustrates an example method 800 for patterning a semiconductor workpiece, according to certain embodiments. Method 800 may be analogous to portions or all of patterning processes 202 and 502, and for purposes of describing example method 800, reference is made primarily to the reference numerals used in connection with FIGS. 2A-2F. Method 800, however, may implement any suitable patterning process.

At step 802, a layer stack 204 may be formed on a wafer (e.g., substrate 206). Layer stack 204 may include a photoresist layer 210 formed on an underlying layer 208. In certain embodiments, photoresist layer 210 includes a MOx photoresist that is deposited on underlying layer 208 using a spin-on deposition process; however, any suitable type of photoresist and any suitable deposition technique may be used. Underlying layer 108 may be a single layer or may include multiple layers, such as layers formed on substrate 206 (e.g., a silicon substrate).

At step 804, photoresist layer 210 is exposed to a pattern of actinic radiation 214.

At step 806, subsequent to exposing photoresist layer 210 to the pattern of actinic radiation 214, a barrier layer 212 is deposited on photoresist layer 210. In certain embodiments, barrier layer 212 is deposited using a spin-on deposition process. Barrier layer 212 may be selected to prevent penetration from one or more environmental components. The one or more environmental components may include, for example, water vapor. As just one particular example, barrier layer 212 is selected to have a water vapor permeability of less than $3.5\times10^{-14}$ [g m $m^{-2}$ $s^{-1}$ $Pa^{-1}$].

In certain embodiments, prior to depositing barrier layer 212 on photoresist layer 210 at step 806, at step 805 an optional liquid rinse 222 of semiconductor workpiece 200 may be performed.

At step 808, a PEB 226 may be performed. In certain embodiments, barrier layer 212 is deposited on photoresist layer 210 prior to performing PEB 226.

At step 810, photoresist layer 210 may be developed using a suitable developer. In certain embodiments, developing photoresist layer 210 also removes barrier layer 212. In certain embodiments, however, a separate removal process may be performed, as illustrated at optional step 809, to remove barrier layer 212 prior to developing photoresist layer 210 at step 810.

At step 812, subsequent processing may be performed on semiconductor workpiece 200. For example, some or all of underlying layer 208 may be etched using the developed photoresist layer 210 as an etch mask to form features in underlying layer 208 or for other suitable purposes. Due at least in part to mitigating environmental impacts on photoresist layer 210 resulting from use of barrier layer 212 (and potentially liquid rinse 222) and the associated improved consistency of critical dimension, such improvements may persist as additional layers of semiconductor workpiece 200 are etched using photoresist layer 210 as an etch mask and be carried forward subsequently in additional etches, if applicable.

Figure 9:
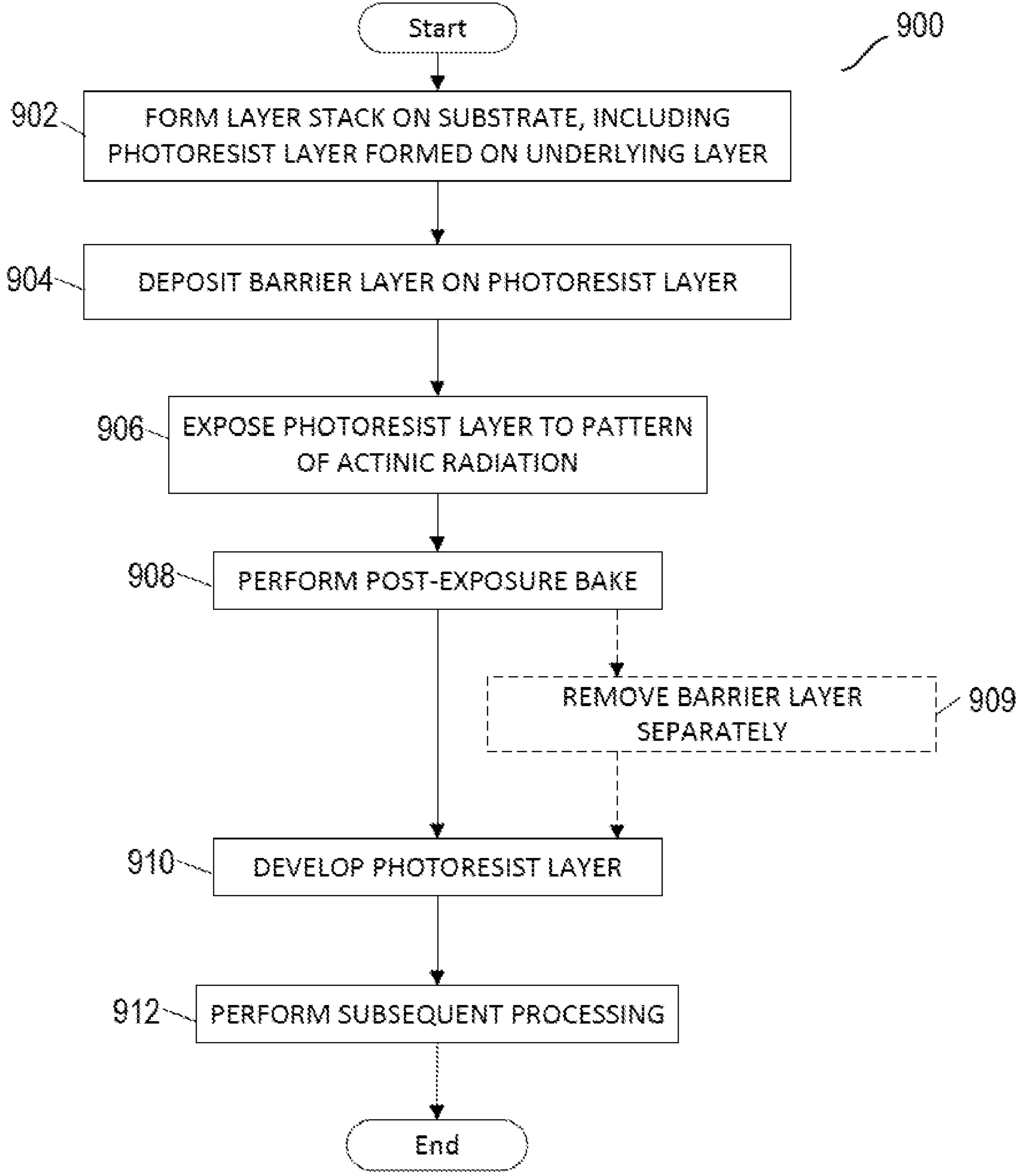
FIG. 9 illustrates an example method for patterning a semiconductor workpiece, according to certain embodiments.

FIG. 9 illustrates an example method 900 for patterning a semiconductor workpiece, according to certain embodiments. Method 900 may be analogous to portions or all of patterning processes 302 and 502, and for purposes of describing example method 900, reference is made primarily to the reference numerals used in connection with FIGS. 3A-3E. Method 900, however, may implement any suitable patterning process.

At step 902, a layer stack 304 may be formed on a wafer (e.g., substrate 306). Layer stack 304 may include a photoresist layer 310 formed on an underlying layer 308. In certain embodiments, photoresist layer 310 includes a MOx photoresist that is deposited on underlying layer 308 using a spin-on deposition process; however, any suitable type of photoresist and any suitable deposition technique may be used. Underlying layer 308 may be a single layer or may include multiple layers, such as layers formed on substrate 306 (e.g., a silicon substrate).

At step 904, prior to exposing photoresist layer 310 to a pattern of actinic radiation 314, a barrier layer 312 is deposited on photoresist layer 310. In certain embodiments, barrier layer 312 is deposited using a spin-on deposition process. Barrier layer 312 may be selected to prevent penetration from one or more environmental components. The one or more environmental components may include, for example, water vapor. As just one particular example, barrier layer 312 is selected to have a water vapor permeability of less than $3.5\times10^{-14}$ [g m $m^{-2}$ $s^{-1}$ $Pa^{-1}$].

At step 906, photoresist layer 310 is exposed to a pattern of actinic radiation 314. In method 900, it may be appropriate for the deposited barrier layer 312 to be relatively transparent relative to actinic radiation 314 such that the pattern of actinic radiation 314 can form exposed regions 318 and unexposed regions 320 according to the target pattern (e.g., provided by pattern mask 316).

At step 908, a PEB 326 may be performed. In certain embodiments, barrier layer 312 is deposited on photoresist layer 310 prior to performing PEB 326.

At step 910, photoresist layer 310 may be developed using a suitable developer. In certain embodiments, developing photoresist layer 310 also removes barrier layer 312. In certain embodiments, however, a separate removal process may be performed, as illustrated at optional step 909, to remove barrier layer 312 prior to developing photoresist layer 310 at step 910.

At step 912, subsequent processing may be performed on semiconductor workpiece 300 in a manner similar to that described above with reference to step 812 of method 800.

Figure 10:
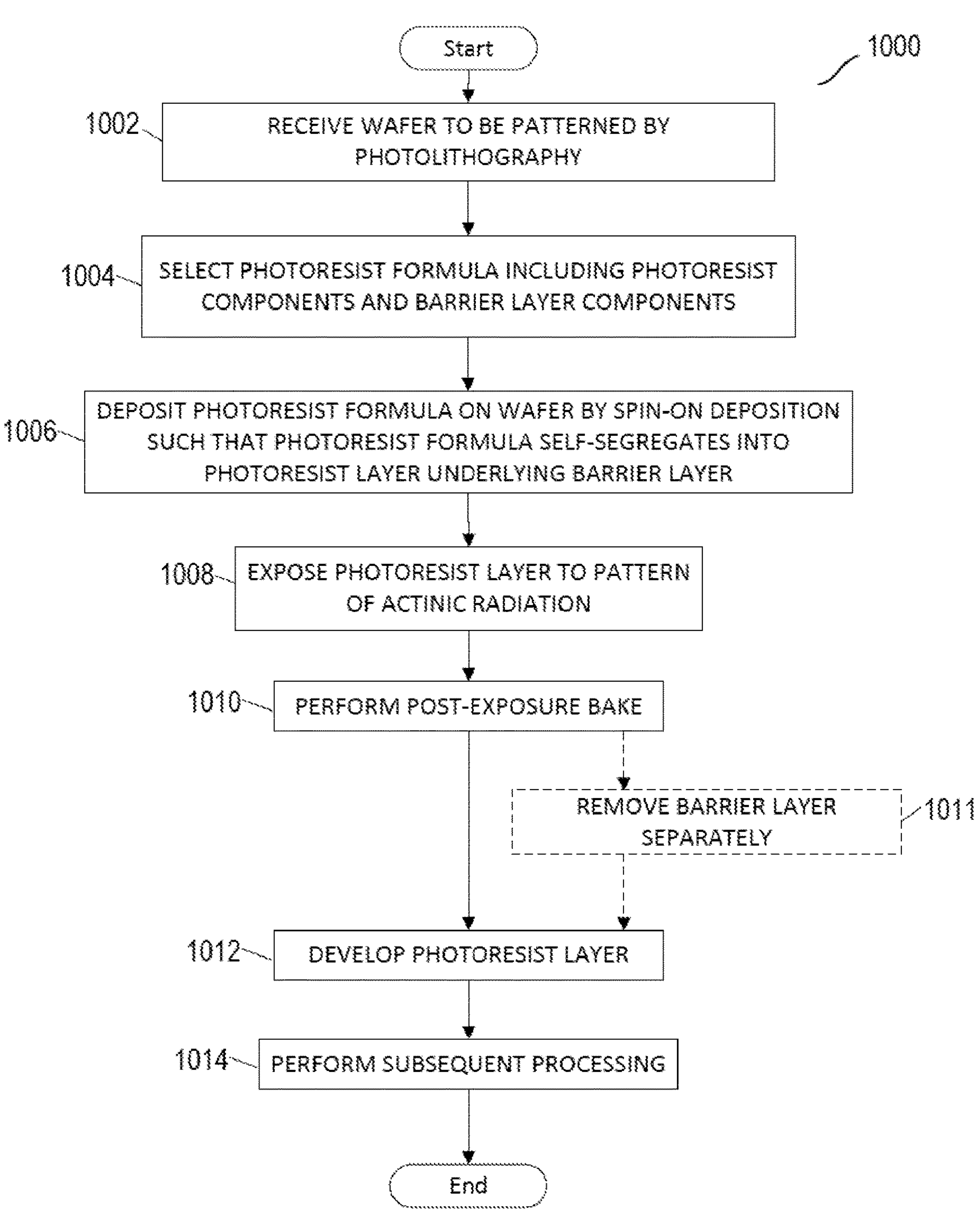
FIG. 10 illustrates an example method for patterning a semiconductor workpiece, according to certain embodiments.

FIG. 10 illustrates an example method 1000 for patterning a semiconductor workpiece, according to certain embodiments. Method 1000 may be analogous to portions or all of patterning processes 402 and 502, and for purposes of describing example method 1000, reference is made primarily to the reference numerals used in connection with FIGS. 4A-4D. Method 1000, however, may implement any suitable patterning process.

At step 1002, a wafer to be patterned by photolithography may be received. For example, the wafer may be a semiconductor workpiece 400 that includes a substrate 406 and underlying layer 408 (which itself may include one or more layers formed as a layer stack 404) formed on substrate 406.

At step 1004, a photoresist formula 429 may be selected that includes photoresist components 430 and barrier layer components 432.

At step 1006, prior to exposing a to-be-formed photoresist layer 410 to a pattern of actinic radiation 414, photoresist formula 429 may be deposited on the wafer (e.g., on underlying layer 408) by spin-on deposition. During the spin-on deposition process, photoresist formula 429 may self-segregate into a photoresist layer 410 underlying a barrier layer 412. In certain embodiments, photoresist layer 310 includes a MOx photoresist. Barrier layer 412 may be selected to prevent penetration from one or more environmental components. The one or more environmental components may include, for example, water vapor. As just one particular example, barrier layer 412 is selected to have a water vapor permeability of less than $3.5\times10^{-14}$ [g m $m^{-2}$ $s^{-1}$ $Pa^{-1}$].

At step 1008, photoresist layer 410 is exposed to the pattern of actinic radiation 414.

At step 1010, a PEB 426 may be performed. In certain embodiments, barrier layer 412 is deposited on photoresist layer 410 prior to performing PEB 426.

At step 1012, photoresist layer 410 may be developed using a suitable developer. In certain embodiments, developing photoresist layer 410 also removes barrier layer 412. In certain embodiments, however, a separate removal process may be performed, as illustrated at optional step 1011, to remove barrier layer 412 prior to developing photoresist layer 410 at step 1012.

At step 1014, subsequent processing may be performed on semiconductor workpiece 400 in a manner similar to that described above with reference to step 812 of method 800.

As an example variation on method 1000, in which an exposure step (e.g., step 1008) may be performed prior to separating photoresist formula 429 into photoresist layer 410 and barrier layer 412 is described above with reference to patterning process 402 (e.g., FIG. 4C), the description of which is incorporated by reference.

Figure 11:
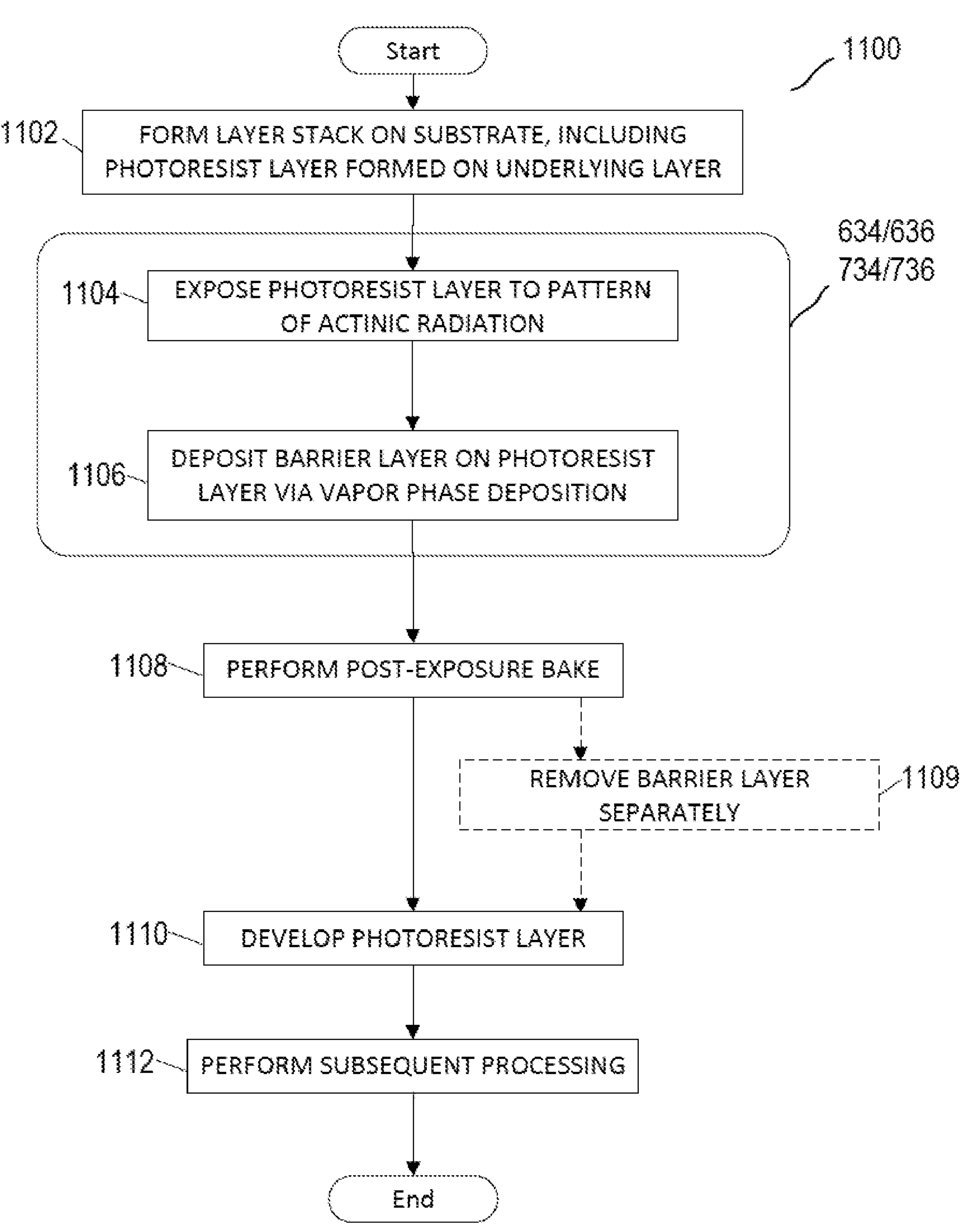
FIG. 11 illustrates an example method for patterning a semiconductor workpiece, according to certain embodiments.

FIG. 11 illustrates an example method 1100 for patterning a semiconductor workpiece, according to certain embodiments. Method 1100 may be analogous to portions or all of patterning processes 502, 602, and 702, and for purposes of describing example method 1100, reference is made primarily to the reference numerals used in connection with FIGS. 6A-6E and/or 7A-7E. Method 1100, however, may implement any suitable patterning process.

At step 1102, a layer stack 604 may be formed on a wafer (e.g., substrate 606). Layer stack 604 may include a photoresist layer 610 formed on an underlying layer 608. In certain embodiments, photoresist layer 610 includes a MOx photoresist that is deposited on underlying layer 608 using a spin-on deposition process; however, any suitable type of photoresist and any suitable deposition technique may be used. Underlying layer 608 may include one or more layers, such as layers formed on substrate 606 (e.g., a silicon substrate).

At step 1104, photoresist layer 610 is exposed to a pattern of actinic radiation 614.

At step 1106, subsequent to exposing photoresist layer 610 to the pattern of actinic radiation 614, a barrier layer 612 is deposited on photoresist layer 610 using a vapor-phase deposition process 638. Barrier layer 612 may be selected to prevent penetration from one or more environmental components. The one or more environmental components may include, for example, water vapor. As just one particular example, barrier layer 612 is selected to have a water vapor permeability of less than $3.5\times10^{-14}$ [g m $m^{-2}$ $s^{-1}$ $Pa^{-1}$].

In certain embodiments, steps 1104 (exposure of photoresist layer 610) and 1106 (deposition of barrier layer 612 by vapor-phase deposition) are performed in a vacuum, such as in a vacuum chamber 634/636 (or vacuum chamber 734/736, as described below in an example variation of method 1100).

At step 1108, a PEB 626 may be performed. In certain embodiments, barrier layer 612 is deposited on photoresist layer 610 prior to performing PEB 626.

At step 1110, photoresist layer 610 may be developed using a suitable developer. In certain embodiments, developing photoresist layer 610 also removes barrier layer 612. In certain embodiments, however, a separate removal process may be performed, as illustrated at optional step 1109, to remove barrier layer 612 prior to developing photoresist layer 610 at step 1110.

At step 1112, subsequent processing may be performed on semiconductor workpiece 600 in a manner similar to that described above with reference to step 812 of method 800.

As an example variation on method 1100 (and as described primarily using the reference numerals of FIGS. 7A-7E), step 1106 is performed prior to step 1104 such that barrier layer 712 is deposited on photoresist layer 710 using a vapor-phase deposition process 738 prior to exposing photoresist layer 710 to a pattern of actinic radiation 714. In such an example, it may be appropriate for the deposited barrier layer 712 to be relatively transparent relative to actinic radiation 714 such that the pattern of actinic radiation 714 can form exposed regions 718 and unexposed regions 720 according to the target pattern (e.g., as provided by pattern mask 716). In certain embodiments, with the reversed order of this alternative implementation, steps 1106 (deposition of barrier layer 712 by vapor-phase deposition) and 1104 (exposure of photoresist layer 710) may be performed in a vacuum, such as vacuum chamber 734/736.

Subsequently, PEB 726 may be executed and then the method may proceed with step 1110 (potentially with step 1109 being executed prior to step 1110).

Methods 800, 900, 1000, and 1100 may be combined with each other or other methods and performed using the systems and apparatuses described herein. For example, method 800 may be combined with any of the embodiments of FIGS. 1-7. Additionally, method 800 may be combined with other methods, such as any of the methods of FIGS. 9-11, for example. Analogous possibilities are true for methods 900, 1000, and 1100. Although shown in a logical order, the arrangement and numbering of the steps of methods 800, 900, 1000, and 1100 are not intended to be limited. The steps of methods 800, 900, 1000, and 1100 may be performed in any suitable order or concurrently with one another as may be apparent to a person of skill in the art.

FIGS. 12-15 illustrate example processing tools that may be used, along or in combination, to implement certain embodiments of this disclosure.

Figure 12:
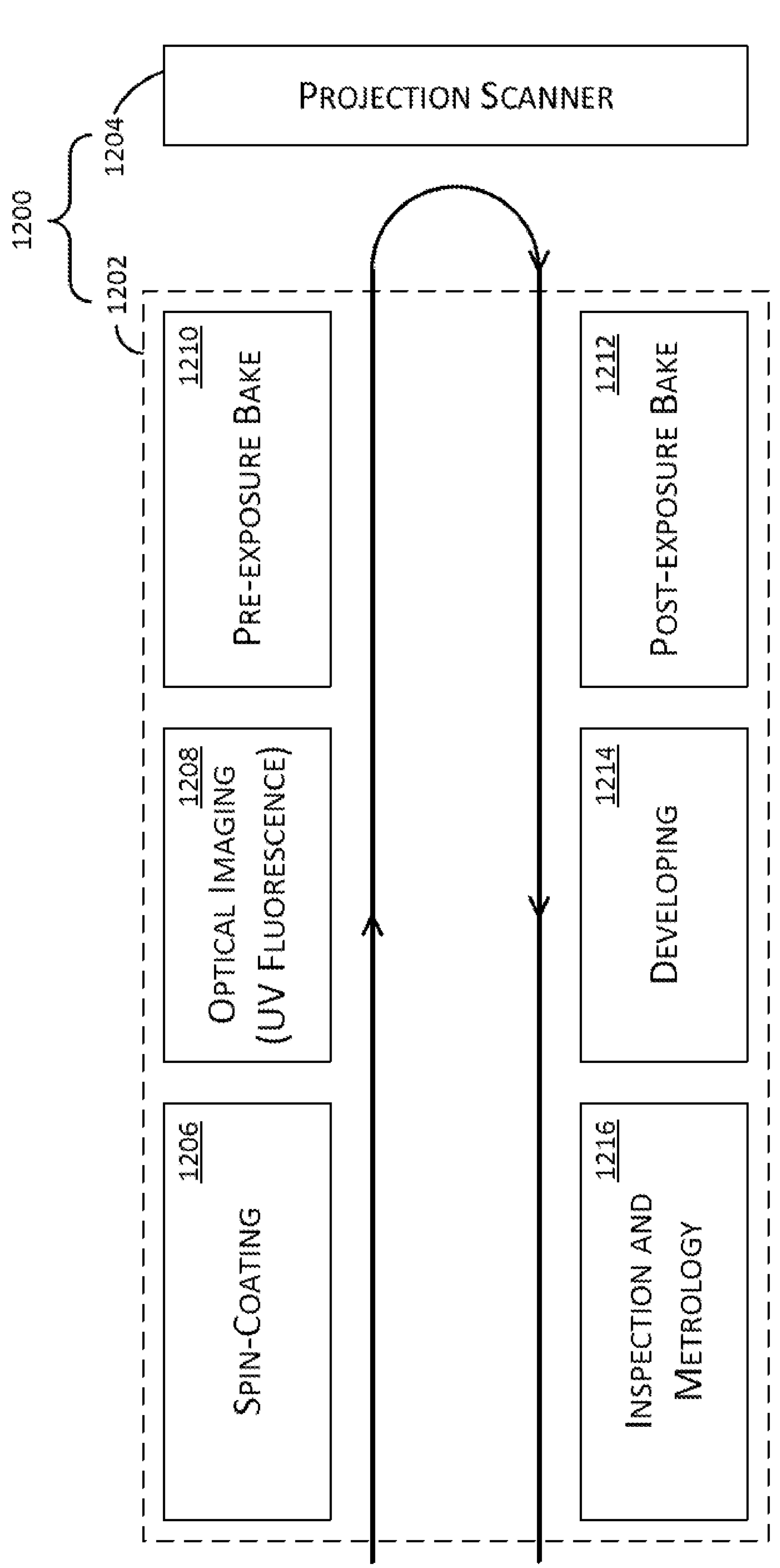
FIG. 12 illustrates a block diagram of an example lithography system, according to certain embodiments.

FIG. 12 illustrates a block diagram of an example lithography system 1200, according to certain embodiments. Lithography system 1200 is just one example of a lithography system that may be used with certain embodiments of this disclosure. In the illustrated example, lithography system 1200 includes a track system 1202 and a projection scanner 1204.

Scanner 1204 may be configured to perform an exposure phase of a photolithography process. In certain embodiments, scanner 1204 is a combination of an optical and mechanical system to scan an optical image of a pattern printed on a photomask (e.g., pattern mask 216, 316, 416, 516, 616, 716) onto the surface of a wafer (e.g., semiconductor workpiece 200, 300, 400, 500, 600, 700) coated with resist (e.g., photoresist layer 210, 310, 410, 510, 610, 710). After scanning the pattern once, scanner 1204 may be operated to step to an adjacent location on the same wafer where the scan is repeated to form another copy of the pattern. In this manner, the photoresist layer is exposed to multiple copies of the pattern arranged in a rectangular matrix on the surface of the wafer.

Track system 1202 includes a series of process modules assembled to allow potentially sequential execution of processes for the lithography process prior to the exposure and after the exposure step performed by scanner 1204. Track system 1202 provides the material processes such as coating the wafer with photoresist, baking the photoresist, and developing the photoresist after exposure. In the illustrated example, the process modules of track system 1202 include a spin-coating module 1206, a pre-exposure bake module 1210, a PEB module 1212, and a developing module 1214 for developing the exposed photoresist. Spin-coating module 1206 includes a spin-coater, an example of which is described below with reference to FIG. 13. Photoresist materials, barrier layer materials, and solvents are connected from a liquid supply system to suitable processing modules (e.g., spin-coating module 1206, developing module 1214, etc.) via pipelines, filters, valves, and pumps.

In addition to process modules, track system 1202 includes an imaging module 1208 and an inspection and metrology (IM) module 1216.

Imaging module 1208 may be an optical imaging module used to identify defects prior to exposing the resist to a radiation pattern in scanner 1204. Wafers coated with photoresist are received from spin-coating module 1206 and imaged in imaging module 1208 using an imaging system that includes light sources and cameras. The light sources are configured to illuminate the wafer, while the cameras create photographic images of the surfaces. In certain embodiments, the imaging system of imaging module 1208 includes cameras to image the wafer from various directions (e.g., from the top (side coated with photoresist), bottom (backside), and side (beveled edges). The cameras may be coupled to a controller of the imaging system that acquires and transmits the images to an inspection device for image analysis. The inspection device may identify defects using, for example, a processor of the inspection device configured to execute instructions stored in an electronic memory of the inspection device to perform appropriate image analysis. A defective wafer may be reworked or scrapped, as appropriate.

IM module 1216 receives wafers after a photoresist layer has been exposed to a pattern of actinic radiation in scanner 1204, and the pattern has been transferred to the photoresist in developing module 1214, where the exposed photoresist is developed to form a patterned photoresist layer. The quality of the photoresist pattern is evaluated by inspecting and measuring various images of the photoresist pattern in IM module 1216. IM module 1216 may include, for example, a scanning electron microscope (SEM) for measuring critical dimensions in the photoresist pattern. Wafers may fail inspection because of patterning defects or if the measurements are not within specified limits. Failed wafers may be discarded, or, if possible, reworked by stripping the photoresist and repeating the photoresist patterning process.

Lithography system 1200 may include a transfer system to move a wafer (e.g., a semiconductor workpiece) from module-to-module of track system 1202, as well as from track system 1202 to projection scanner 1204 (which may be considered "off track") and from projection scanner back to track system 1202.

Figure 13:
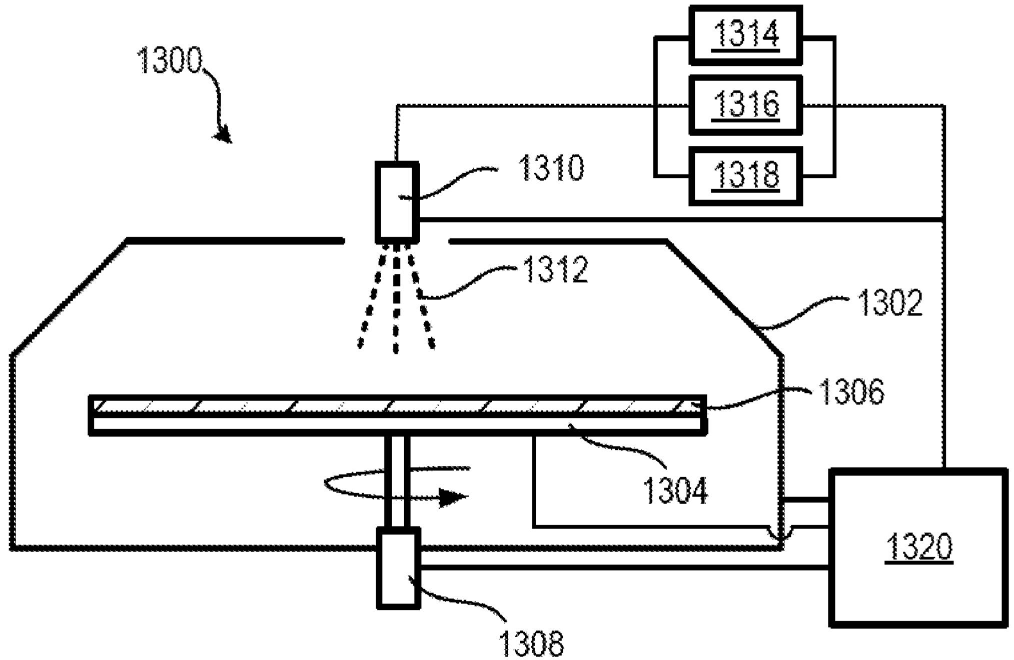
FIG. 13 illustrates an example liquid-based spin-on deposition system, according to certain embodiments.

FIG. 13 illustrates an example liquid-based spin-on deposition system 1300, according to certain embodiments. For example, liquid-based spin-on deposition system 1300 may be used to process any of the semiconductor workpieces described in this disclosure to deposit any of the photoresist layers, barrier layers, photoresist formulas, or other suitable layers described in this disclosure. In certain embodiments, spin-on deposition system 1300 may be a semi-closed spin-on deposition system used for coating substrates (wafers) with a desired layer. The semi-closed configuration may allow fume control and minimize exhaust volume.

In the illustrated example, spin-on deposition system 1300 includes a process chamber 1302 that includes a substrate holder 1304 for supporting, heating, and rotating (spinning) a substrate 1306 (which may include any of the semiconductor workpieces described in this disclosure at appropriate stages of processing), a rotating apparatus 1308 (e.g., a motor), and a liquid delivery nozzle 1310 configured for providing a processing liquid 1312 to an upper surface of the substrate 1306. Liquid supply systems 1314, 1316 and 1318 supply different processing liquids to the liquid delivery nozzle 1310. For depositing a photoresist, the different processing liquids can include, for example, a first reactant in a first liquid (e.g., a metal (e.g., tin)-containing precursor), a second reactant (e.g., an oxygen-containing precursor) in a second liquid, and a rinsing liquid. In certain embodiments, spin-on deposition system 1300 includes additional liquid delivery nozzles for providing different liquids to substrate 1306. Example rotating speeds can be between about 500 rpm and about 1500 rpm, for example 1000 rpm, during exposure of an upper surface of substrate 1306 to processing liquid 1312.

Spin-on deposition system 1300 may include a controller 1320 that can be coupled to and control process chamber 1302; liquid supply systems 1314, 1316 and 1318; liquid delivery nozzle 1310; rotating apparatus 1308, mechanism for heating substrate holder 1304. Substrate 1306 may be under an inert atmosphere during film deposition. Spin-on deposition system 1300 may be configured to process substrates 1306 of any suitable size.

Figure 14:
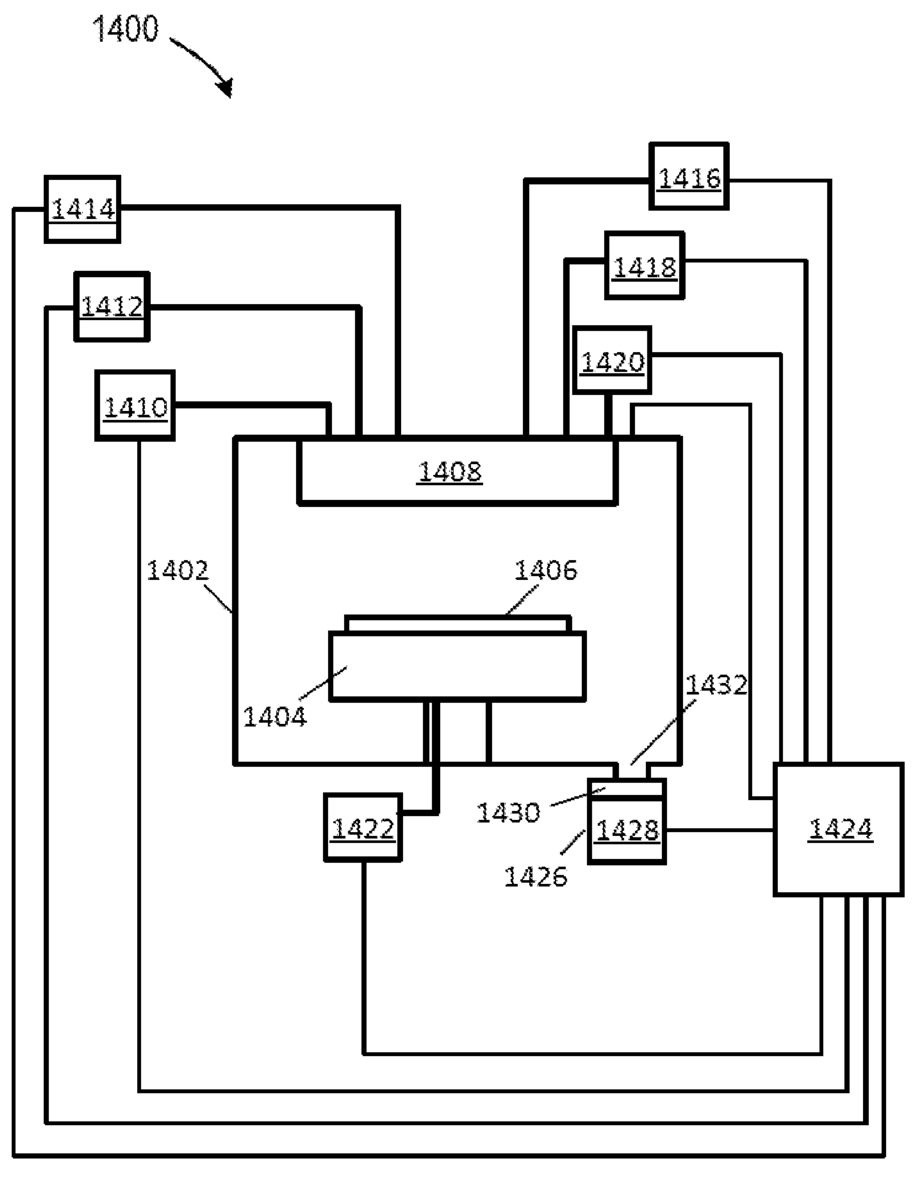
FIG. 14 illustrates an example processing system for a chemical vapor deposition (CVD) or atomic layer deposition (ALD) process, according to certain embodiments.

FIG. 14 illustrates an example processing system 1400 for a CVD or an ALD process, according to certain embodiments. In the illustrated example, processing system 1400 includes a process chamber 1402 having a substrate holder 1404 configured to support a substrate 1406 (analogous to substrate 1306 of FIG. 13), upon which a photoresist layer is deposited. Process chamber 1402 may include an upper assembly 1408 (e.g., a showerhead) coupled to a first precursor supply system 1410 configured for supplying one or more first precursor gases. A second precursor supply system 1412 is configured for supplying a second precursor gas. The second precursor gas can include, for example, an alkenol, an alcohol, a diol, a phenol, a carboxylic acid, or a combination thereof. Processing system 1400 further includes a purge gas supply system 1414 and auxiliary gas supply systems 1416, 1418, and 1420. The auxiliary gas supply systems 1416, 1418, and 1420, may, for example, be used for supplying additional precursor gases into process chamber 1402.

Additionally, processing system 1400 includes a substrate temperature control system 1422 coupled to substrate holder 1404 and configured to elevate and control the temperature of substrate 1406. Substrate temperature control system 1422 contains temperature control elements, such as a cooling system including a re-circulating coolant flow that receives heat from substrate holder 1404 and transfers heat to a heat exchanger system, or when heating, transfers heat from the heat exchanger system. Additionally, the temperature control elements can include heating/cooling elements, such as resistive heating elements, or thermo-electric heaters/coolers, which can be included in substrate holder 1404, as well as the chamber wall of process chamber 1402 and any other component within processing system 1400. Substrate temperature control system 1422 can be configured to, for example, elevate and control the substrate temperature from room temperature to approximately 350° C. to approximately 550° C. Alternatively, the substrate temperature can, for example, range from approximately 150° C. to approximately 350° C. The temperature of substrate 1406 may be selected based on the desired temperature for causing deposition of a particular layer on the surface of a given substrate 1406.

Processing system 1400 may include a controller 1424 that can be coupled to process chamber 1402, substrate holder 1404, upper assembly 1408 configured for introducing process gases into process chamber 1402; precursor supply systems 1410 and 1412; purge gas supply system 1414; auxiliary gas supply system 1416, 1418, and 1420; and substrate temperature control system 1422. Additionally or alternatively, controller 1424 can be coupled to one or more additional controllers/computers, and controller 1424 can obtain setup and/or configuration information from an additional controller/computer.

In the illustrated example, singular processing elements (1402, 1404, 1408, 1410, 1412, 1414, 1416, 1418, 1420, and 1422) are shown; however, processing system 1400 may include any number of processing elements having any number of associated controllers in addition to independent processing elements. Controller 1424 can be used to configure any number of processing elements, and controller 1424 can collect, provide, process, store, and display data from processing elements. Controller 1424 can include a number of applications for controlling one or more of the processing elements. For example, controller 1424 can include a graphic user interface (GUI) component that can provide easy to use interfaces that enable a user to monitor and/or control one or more processing elements.

Processing system 1400 may be configured to process substrates 1406 of any suitable size. Furthermore, a batch processing system implementation may be capable of processing multiple substrates 1406 simultaneously.

In certain embodiments, various techniques may be used for introducing precursor gases to process chamber 1402. One technique includes vaporizing precursors through the use of separate bubblers or direct liquid injection (DLI) systems, or a combination thereof, and then mixing in the gas phase within or prior to introduction into process chamber 1402. Another technique includes separately controlling two or more different liquid sources (neat precursors or precursor solutions), which are then mixed prior to entering a common vaporizer. This technique may be used when the precursors are compatible in solution or in liquid form and have similar vaporization characteristics. Another technique includes controlling the flow of a liquid precursor mixture (neat precursors or precursor solutions) to a common vaporizer. Other techniques include using compatible mixed solid or liquid precursors within a bubbler. Liquid source precursors may include neat liquid precursors, or solid or liquid precursors that are dissolved in a compatible solvent. Possible compatible solvents include, but are not limited to, ionic liquids, hydrocarbons (aliphatic, olefins, and aromatic), amines, esters, glymes, crown ethers, ethers and polyethers. In certain embodiments, it may be possible to dissolve one or more compatible solid precursors in one or more compatible liquid precursors. By controlling relative concentration levels of the first and second precursors within a gas pulse, it is possible to deposit films with desired stoichiometries.

Purge gas supply system 1414 may be configured to introduce a purge gas to process chamber 1402. For example, a purge gas may be introduced between introduction of pulses of a first precursor and a second precursor gas to process chamber 1402. The purge gas can contain an inert gas, such as a noble gas (i.e., He, Ne, Ar, Kr, Xe), nitrogen ($N_2$), or hydrogen ($H_2$).

To improve the thermal transfer between substrate 1406 and substrate holder 1404, substrate holder 1404 may include a mechanical clamping system, or an electrical clamping system, such as an electrostatic clamping system, to affix substrate 1406 to an upper surface of substrate holder 1404. Substrate holder 1404 may include a substrate backside gas delivery system to introduce gas to the back-side of substrate 1406 to improve the gas-gap thermal conductance between substrate 1406 and substrate holder 1404. Such a system can be used when temperature control of substrate 1406 is desired at elevated or reduced temperatures.

Process chamber 1402 may be coupled to a pressure control system 1426, including a vacuum pumping system 1428 and a valve 1430, through a duct 1432. Pressure control system 1426 may be configured to controllably evacuate process chamber 1402 to a pressure suitable for forming a desired film on substrate 1406, and suitable for use of the precursors. Vacuum pumping system 1428 may include a turbo-molecular vacuum pump (TMP) or a cryogenic pump capable of a pumping speed up to about 5000 liters per second (and greater), and valve 1430 may include a gate valve for throttling the chamber pressure. Moreover, a device for monitoring chamber pressure may be coupled to process chamber 1402. Pressure control system 1426 may be configured to control the process chamber pressure between about 0.1 Torr and about 100 Torr during deposition of a film.

Precursor supply systems 1410 and 1412; purge gas supply system 1414; auxiliary gas supply system 1416, 1418, and 1420 may include one or more pressure control devices, one or more flow control devices, one or more filters, one or more valves, and/or one or more flow sensors. The flow control devices may include pneumatic driven valves, electro-mechanical (solenoidal) valves, and/or high-rate pulsed gas injection valves. The gases may be sequentially and alternately pulsed into process chamber 1402, where the length of each gas pulse can be between, for example, about 0.1 sec and about 100 sec. Alternatively, the length of each gas pulse can be between about 1 sec and about 10 sec. Exemplary gas pulse lengths for precursor gases can be between 0.3 and 3 sec, for example 1 sec. Exemplary purge gas pulses can be between 1 and 20 sec, for example 3 sec.

Controller 1424 may include a microprocessor, memory, and digital I/O port capable of generating control voltages sufficient to communicate and activate inputs to processing system 1400 as well as monitor outputs from processing system 1400. Moreover, controller 1424 may be coupled to and may exchange information with process chamber 1402; substrate holder 1404; upper assembly 1408, precursor supply systems 1410 and 1412, purge gas supply system 1414, auxiliary gas supply systems 1416, 1418, and 1420; substrate temperature control system 1422, substrate temperature control system 1422, and pressure control system 1426. For example, a program stored in the memory may be utilized to activate the inputs to these components of processing system 1400 according to a recipe to perform a deposition process.

Figure 15:
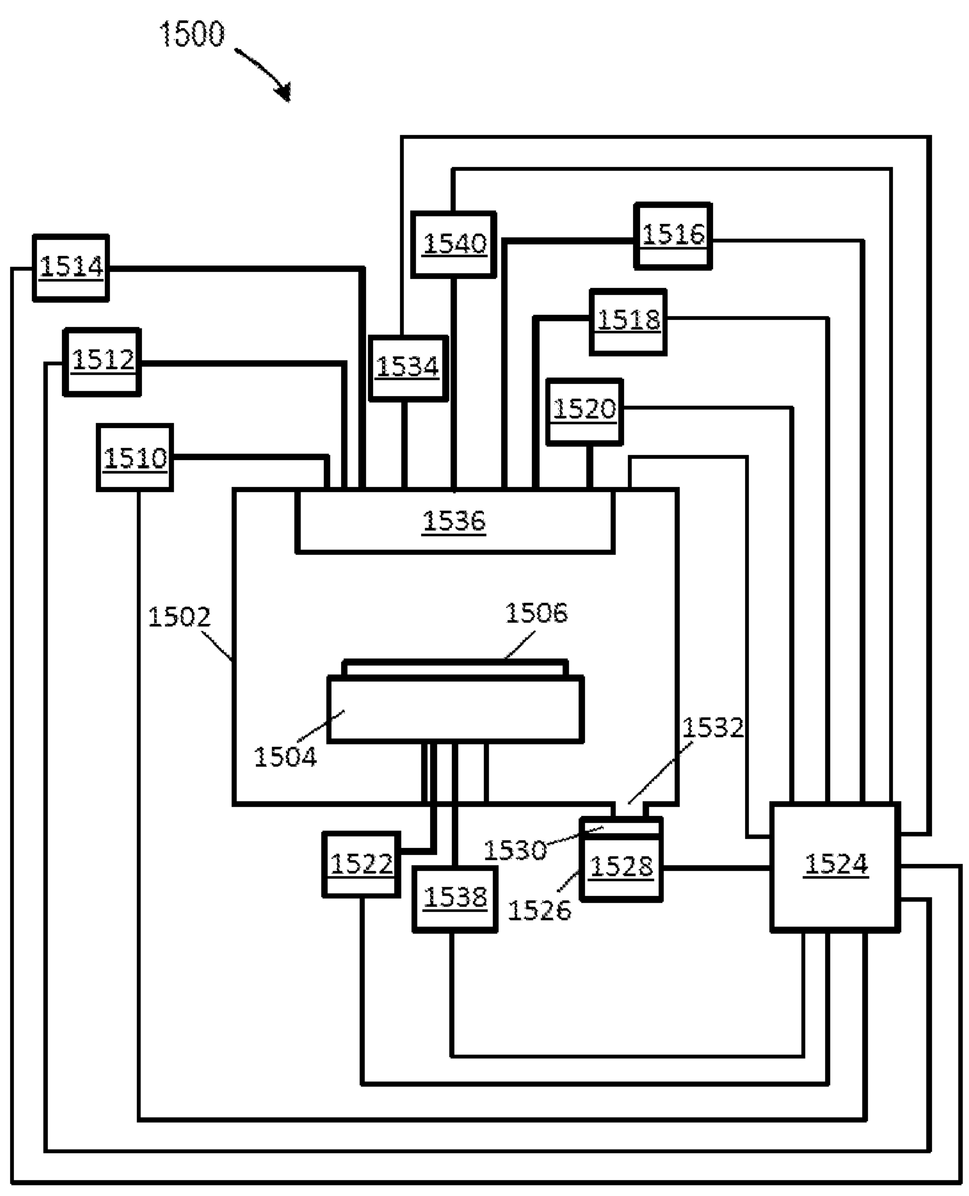
FIG. 15 illustrates an example processing system for a plasma-enhanced CVD (PECVD) or plasma-enhanced ALD (PEALD) process, according to certain embodiments.

FIG. 15 illustrates an example plasma processing system 1500 for a PECVD or plasma-enhanced ALD (PEALD) process, according to certain embodiments. In certain embodiments, plasma processing system 1500 may be configured for performing PEALD and/or PECVD processing, in addition to being able to perform ALD or CVD processing. Plasma processing system 1500 is similar to processing system 1400 described with reference to FIG. 14, but further includes a plasma generation system configured to generate a plasma during at least a portion of the gas exposures in process chamber 1502. To reiterate, for brevity and clarity, this description adopts a convention in which elements adhering to the pattern [x02] may be related implementations of a system in certain embodiments.

The plasma generation system includes a first power source 1534 coupled to process chamber 1502, and configured to couple power to gases introduced into process chamber 1502. First power source 1534 may be a variable power source and may include a radio frequency (RF) generator and an impedance match network, and may further include an electrode through which RF power is coupled to the plasma in process chamber 1502. The electrode can be formed in an upper assembly 1536, and it can be configured to oppose substrate holder 1404. The impedance match network can be configured to optimize the transfer of RF power from the RF generator to the plasma by matching the output impedance of the match network with the input impedance of process chamber 1502, including the electrode, and plasma. For example, the impedance match network serves to improve the transfer of RF power to plasma in process chamber 1502 by reducing the reflected power.

Alternatively, first power source 1534 may include a RF generator and an impedance match network, and may further include an antenna, such as an inductive coil, through which RF power is coupled to plasma in process chamber 1502. The antenna can, for example, include a helical or solenoidal coil, such as in an inductively coupled plasma source or helicon source, or it can, for example, include a flat coil as in a transformer coupled plasma source.

Alternatively, first power source 1534 may include a microwave frequency generator, and a microwave antenna and microwave window through which microwave power is coupled to plasma in process chamber 1502. Electron cyclotron resonance (ECR) technology or surface wave plasma technology may be used to accomplish coupling of microwave power.

In certain embodiments, plasma processing system 1500 includes a substrate bias generation system configured to generate or assist in generating a plasma (through substrate holder biasing) during at least a portion of the alternating introduction of the gases to process chamber 1502. The substrate bias system can include a substrate power source 1538 coupled to process chamber 1502 and configured to couple power to substrate 1506. Substrate power source 1538 may include a RF generator and an impedance match network, and may further include an electrode (e.g., formed in substrate holder 1504) through which RF power is coupled to substrate 1506. For example, substrate holder 1504 can be electrically biased at an RF voltage via transmission of RF power from an RF generator through an impedance match network to substrate holder 1504. A typical frequency for the RF bias can range from about 0.1 MHz to about 100 MHz, and can be 13.56 MHz. Alternatively, RF power may be applied to the substrate holder electrode at multiple frequencies. Although the plasma generation system and the substrate bias system are illustrated in FIG. 15 as separate entities, they may include one or more power sources coupled to substrate holder 1504.

In certain embodiments, plasma processing system 1500 includes a remote plasma system 1540 for providing and remotely plasma-exciting gases, prior to flowing the plasma-excited gas into process chamber 1502 where it is exposed to substrate 1506. Remote plasma system 1540 may include a microwave frequency generator. The process chamber pressure can be between about 0.1 Torr and about 10 Torr, or between about 0.2 Torr and about 3 Torr.

Certain embodiments may provide none, some, or all of the following technical advantages. Other advantages may be described throughout this disclosure or otherwise be apparent from this disclosure to one of skill in the art.

In certain embodiments, barrier layer materials designed to reduce or eliminate environmental impacts during photoresist processing can be added to photolithography stacks to help protect wafers from environmental damage for improved yield of devices. Certain embodiments may improve an ability to achieve a desired critical dimension by reducing or eliminating unintended changes in the structure of photoresist layers (e.g., MOx photoresist layer) resulting from penetration of water vapor following exposure. Certain embodiments may reduce or eliminate variation in critical dimension due to environmental impacts on a spun-on MOx layer, such as a photoresist layer.

Furthermore, although this disclosure has been described primarily in the context of lithography, certain embodiments of this disclosure may apply to other applications or environments in which spun-on metalorganic material like a MOx are used. For example, this disclosure contemplates depositing a barrier layer designed to reduce environmental impacts on spun-on metalorganic layers in any suitable context even outside the context of lithography, according to principles and embodiments described in this disclosure.

Example embodiments of this disclosure are summarized here. Other embodiments can also be understood from the entirety of the specification as well as the claims filed herein.

Example 1. A method of microfabrication includes forming a layer stack on a wafer, the layer stack including a photoresist layer formed on an underlying layer. The method further includes depositing a barrier layer on the photoresist layer, the barrier layer selected to prevent penetration from one or more environmental components. The method further includes exposing the photoresist layer to a pattern of actinic radiation and developing the photoresist layer.

Example 2. The method of Example 1, where the barrier layer is deposited prior to exposing the photoresist layer to the pattern of actinic radiation.

Example 3. The method of Example 1, where the barrier layer is deposited subsequent to exposing the photoresist layer to the pattern of actinic radiation.

Example 4. The method of any one of Examples 1-3, where the barrier layer is deposited using a spin-on deposition process.

Example 5. The method of any one of Examples 1-4, further including executing a post exposure bake, where the barrier layer is deposited prior to the post exposure bake.

Example 6. The method of any one of Examples 1-5, where the one or more environmental components include water vapor.

Example 7. The method of any one of Examples 1-6, where the barrier layer is selected to have a water vapor permeability of less than $3.5\times10^{-14}$ [g m $m^{-2}$ $s^{-1}$ $Pa^{-1}$].

Example 8. The method of any one of Examples 1-7, where the photoresist layer includes a metal-oxide photoresist that is deposited on the underlying layer using a spin-on deposition process.

Example 9. The method of any one of Examples 1-8, where developing the photoresist layer also removes the barrier layer.

Example 10. The method of any one of Examples 1-8, further comprising removing the barrier layer prior to developing the photoresist layer.

Example 11. The method of any one of Examples 1-10, where the underlying layer includes multiple layers, the multiple layers being formed on a silicon substrate.

Example 12. A method of microfabrication includes receiving a wafer to be patterned by photolithography and selecting a photoresist formula including photoresist components and barrier layer components. The photoresist formula is configured to self-segregate so that the barrier layer components separate vertically above the photoresist components. The method further includes depositing the photoresist formula on the wafer by spin-on deposition, the photoresist formula self-segregating into a photoresist layer underlying a barrier layer. The method further includes exposing the photoresist layer to a pattern of actinic radiation and developing the photoresist layer.

Example 13. The method of Example 12, further including executing a post exposure bake, where the barrier layer is deposited prior to the post exposure bake.

Example 14. The method of any one of Examples 12-13, where the barrier layer components are selected to prevent penetration from water vapor.

Example 15. The method of any one of Examples 12-14, where the barrier layer components are selected to have a water vapor permeability of less than $3.5\times10^{-14}$ [g m $m^{-2}$ $s^{-1}$ $Pa^{-1}$].

Example 16. The method of any one of Examples 12-15, where the photoresist components include a metal-oxide photoresist.

Example 17. A method of microfabrication includes forming a layer stack on a wafer, the layer stack including a photoresist layer formed over one or more underlying layers. The method further includes depositing a barrier layer on the photoresist layer by vapor-phase deposition, the barrier layer selected to prevent penetration from one or more environmental components. The method further includes exposing the photoresist layer to a pattern of actinic radiation and developing the photoresist layer.

Example 18. The method of Example 17, where the barrier layer is deposited prior to exposing the photoresist layer to the pattern of actinic radiation.

Example 19. The method of Example 17, where the barrier layer is deposited subsequent to exposing the photoresist layer to the pattern of actinic radiation.

Example 20. The method of any one of Examples 17-19, where depositing the barrier layer on the photoresist layer by vapor-phase deposition and exposing the photoresist layer to the pattern of actinic radiation are performed in a vacuum.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

"Substrate," "target substrate," "structure," or "device" as used herein generically refers to an object being processed in accordance with the disclosure, and may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate, structure, or device is not limited to any particular base structure, underlying layer or overlying layer, patterned or un-patterned, but rather, is contemplated to include any such layer or base structure, and any combination of layers and/or base structures. The description may reference particular types of substrates, structures, or devices, but this is for illustrative purposes only.

Although this disclosure describes particular process steps as occurring in a particular order, this disclosure contemplates the process steps occurring in any suitable order. While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method of microfabrication, the method comprising:

forming a layer stack on a wafer, the layer stack including a photoresist layer formed on an underlying layer;

exposing the photoresist layer to a pattern of actinic radiation to pattern the photoresist layer;

depositing, subsequent to exposing the photoresist layer to the pattern of actinic radiation, a barrier layer on the photoresist layer, the barrier layer selected to prevent penetration from one or more environmental components, wherein neither the barrier layer nor another barrier layer selected to prevent penetration from the one or more environmental components is present on the photoresist layer during the exposing of the photoresist layer to the pattern of actinic radiation to pattern the photoresist layer; and developing the photoresist layer.

2. The method of claim 1, wherein the barrier layer is deposited using a spin-on deposition process.

3. The method of claim 1, further comprising executing a post exposure bake, wherein the barrier layer is deposited prior to the post exposure bake.

4. The method of claim 1, wherein the one or more environmental components include water vapor.

5. The method of claim 4, wherein the barrier layer is selected to have a water vapor permeability of less than $3.5\times10^{-14}$ [g m $m^{-2}$ $s^{-1}$ $Pa^{-1}$].

6. The method of claim 1, wherein the photoresist layer includes a metal-oxide photoresist that is deposited on the underlying layer using a spin-on deposition process.

7. The method of claim 1, wherein developing the photoresist layer also removes the barrier layer.

8. The method of claim 1, further comprising removing the barrier layer prior to developing the photoresist layer.

9. The method of claim 1, further comprising performing, subsequent to exposing the photoresist layer to the pattern of actinic radiation and prior to depositing the barrier layer on the photoresist layer, a liquid rinse, the liquid rinse introducing a controlled amount of moisture into the photoresist layer.

10. A method of microfabrication, the method comprising:

receiving a wafer to be patterned by photolithography;

selecting a photoresist formula including photoresist components and barrier layer components, the barrier layer components comprising a fluorinated polynorbornene, the photoresist formula configured to self-segregate so that the barrier layer components separate vertically above the photoresist components;

depositing the photoresist formula on the wafer by spin-on deposition, the photoresist formula self-segregating into a photoresist layer underlying a barrier layer;

executing a post-deposition bake;

exposing, subsequent to executing the post-deposition bake, the photoresist layer to a pattern of actinic radiation; and developing the photoresist layer.

11. The method of claim 10, further comprising executing a post exposure bake, wherein the barrier layer is deposited prior to the post exposure bake.

12. The method of claim 10, wherein the barrier layer components are selected to prevent penetration from water vapor.

13. The method of claim 12, wherein the barrier layer components are selected to have a water vapor permeability of less than $3.5\times10^{-14}$ [g m $m^{-2}$ $s^{-1}$ $Pa^{-1}$].

14. The method of claim 10, wherein the photoresist components include a metal-oxide photoresist.

15. The method of claim 10, wherein:

the photoresist components comprise a polymeric chemically-amplified resist; and the photoresist formula comprises the photoresist components blended with the barrier layer components dissolved in a polar organic solvent.

16. A method of microfabrication, the method comprising:

forming a layer stack on a wafer, the layer stack including a photoresist layer formed over one or more underlying layers;

exposing the photoresist layer to a pattern of actinic radiation;

depositing, subsequent to exposing the photoresist layer to the pattern of actinic radiation, a barrier layer on the photoresist layer by vapor-phase deposition, the barrier layer selected to prevent penetration from one or more environmental components, the vapor-phase deposition forming the barrier layer on a top surface of the photoresist layer;

performing, subsequent to depositing the barrier layer on the photoresist layer, a post exposure bake; and developing the photoresist layer.

17. The method of claim 16, wherein depositing the barrier layer on the photoresist layer by vapor-phase deposition and exposing the photoresist layer to the pattern of actinic radiation are performed in a vacuum.

18. The method of claim 16, wherein depositing the barrier layer on the photoresist layer by vapor-phase deposition and exposing the photoresist layer to the pattern of actinic radiation are performed in a same vacuum, allowing the depositing of the barrier layer and the exposing of the photoresist layer to the pattern of actinic radiation to be performed in a continuous vacuum at both stages.

19. The method of claim 16, further comprising performing, subsequent to exposing the photoresist layer to the pattern of actinic radiation and prior to depositing the barrier layer on the photoresist layer, a liquid rinse, the liquid rinse introducing a controlled amount of moisture into the photoresist layer.

20. The method of claim 16, further comprising removing the barrier layer prior to developing the photoresist layer.

* * * * *